United States Patent
Kameda et al.

(10) Patent No.: US 9,856,560 B2
(45) Date of Patent: Jan. 2, 2018

(54) METHOD FOR MANUFACTURING SEMICONDUCTOR DEVICE AND SUBSTRATE PROCESSING APPARATUS

(75) Inventors: Kenji Kameda, Toyama (JP); Jie Wang, Toyama (JP); Yuji Urano, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 604 days.

(21) Appl. No.: 12/379,471

(22) Filed: Feb. 23, 2009

(65) Prior Publication Data

US 2009/0170328 A1 Jul. 2, 2009

Related U.S. Application Data

(62) Division of application No. 12/292,995, filed on Dec. 2, 2008, now abandoned.

(30) Foreign Application Priority Data

| Dec. 5, 2007 | (JP) | 2007-314775 |
| Feb. 27, 2008 | (JP) | 2008-046073 |
| Oct. 8, 2008 | (JP) | 2008-261326 |

(51) Int. Cl.
*H01L 21/311* (2006.01)
*C23C 16/44* (2006.01)

(52) U.S. Cl.
CPC ............... *C23C 16/4405* (2013.01)

(58) Field of Classification Search
CPC .................................. C23C 16/4405

(Continued)

(56) References Cited

U.S. PATENT DOCUMENTS

| 6,475,627 B1 | 11/2002 | Ose |
| 2003/0170402 A1 | 9/2003 | Arai et al. |

(Continued)

FOREIGN PATENT DOCUMENTS

| EP | 1 933 388 A1 | 6/2008 |
| JP | A-2000-138168 | 5/2000 |

(Continued)

OTHER PUBLICATIONS

Japanese Office Action issued in Japanese Patent Application No. 2008-261326 dated Mar. 2, 2010.

(Continued)

*Primary Examiner* — Alexander Markoff
(74) *Attorney, Agent, or Firm* — Oliff PLC

(57) ABSTRACT

The method according to the invention includes the steps of: purging an inside of the processing chamber with gas while applying a thermal impact onto the thin film deposited on the inside of the processing chamber by decreasing the temperature in the processing chamber, so as to forcibly generate a crack in the thin film and forcibly peel the adhered material with a weak adhesive force, in a state where the substrate is not present in the processing chamber; removing the thin film deposited on the inside of the processing chamber by supplying a fluorine-based gas to the inside of the processing chamber heated to a first temperature, in the state where the substrate is not present in the processing chamber; and removing an adhered material remaining on the inside of the processing chamber after removing the thin film by supplying a fluorine-based gas to the inside of the processing chamber heated to a second temperature, in the state where the substrate is not present in the processing chamber.

19 Claims, 10 Drawing Sheets

(58) Field of Classification Search
USPC ........ 134/1, 1.1, 22.1, 22.18, 26, 30, 34, 38; 438/905
See application file for complete search history.

(56) References Cited

U.S. PATENT DOCUMENTS

| | | | |
|---|---|---|---|
| 2003/0192569 A1* | 10/2003 | Goto et al. | 134/1.1 |
| 2005/0090123 A1* | 4/2005 | Nishimura et al. | 438/800 |
| 2005/0139578 A1* | 6/2005 | Fukuda et al. | 216/67 |
| 2006/0068598 A1* | 3/2006 | Okada et al. | 438/758 |
| 2006/0141782 A1* | 6/2006 | Hasebe et al. | 438/680 |
| 2006/0201533 A1 | 9/2006 | Wani et al. | |
| 2007/0093075 A1* | 4/2007 | Noro et al. | 438/778 |
| 2008/0003362 A1* | 1/2008 | Nodera et al. | 427/255.28 |
| 2009/0117743 A1* | 5/2009 | Nodera et al. | 438/694 |
| 2009/0124083 A1* | 5/2009 | Nodera et al. | 438/694 |

FOREIGN PATENT DOCUMENTS

| | | |
|---|---|---|
| JP | A-2002-134488 | 5/2002 |
| JP | A-2002-317269 | 10/2002 |
| JP | A-2003-264186 | 9/2003 |
| JP | A-2003-526731 | 9/2003 |
| JP | A-2004-343026 | 12/2004 |
| JP | A-2005-039153 | 2/2005 |
| JP | 2005277302 A * | 10/2005 |
| JP | A-2006-059921 | 3/2006 |
| WO | WO 99/36589 A1 | 7/1999 |
| WO | WO 2007/040183 A1 | 4/2007 |

OTHER PUBLICATIONS

Office Action dated Dec. 9, 2010 issued in U.S. Appl. No. 12/292,995.
Aug. 5, 2011 Office Action issued in U.S. Appl. No. 12/292,995.
Taiwanese Office Action dated Feb. 24, 2012 in Taiwanese Patent Application No. 97140822 (with translation).
Notification of Reason(s) for Refusal dated Jan. 11, 2012 in Japanese Application No. 2009-062046 (with translation).
Dec. 16, 2011 Office Action issued in U.S. Appl. No. 12/292,995.
Dec. 25, 2012 Office Action issued in Japanese Patent Application No. 2010-099117 (with English-language translation).
Dec. 5, 2013 Office Action issued in U.S. Appl. No. 12/292,995.

* cited by examiner (a)

(b)

| TEMPERATURE (°C) | ETCHING RATE (Å/min) | | SELECTION RATIO (Si3N4 FILM/QUARTZ) |
|---|---|---|---|
| | Si3N4 FILM | QUARTZ | |
| 300 | 23 | 11 | 2.1 |
| 350 | 91 | 62 | 1.5 |
| 400 | 289 | 207 | 1.4 |
| 450 | 836 | 723 | 1.2 |
| 500 | 1675 | 1980 | 0.8 |

PRESSURE IN PROCESSING CHAMBER: 100 Torr, F2 GAS CONCENTRATION: 20%

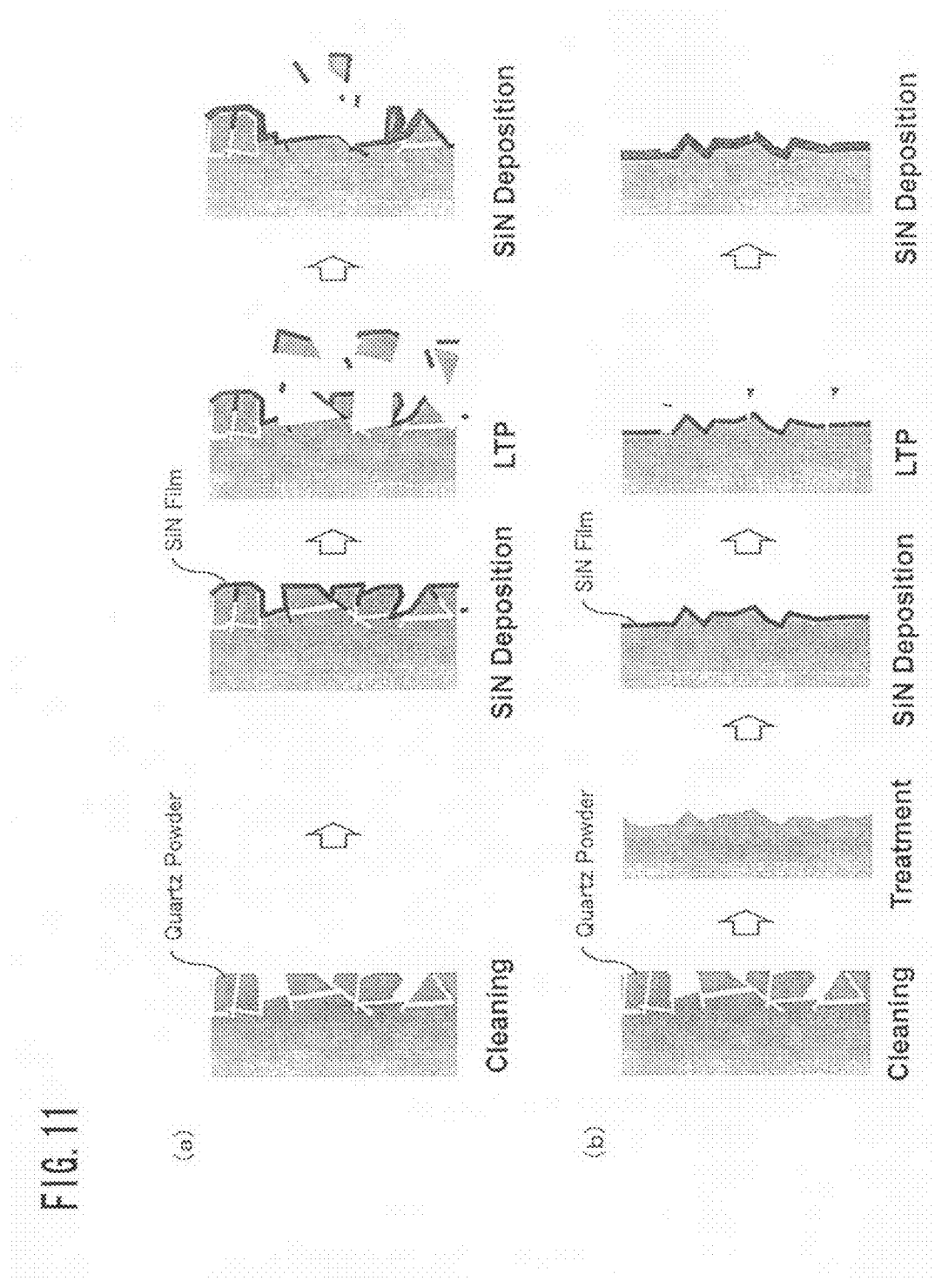

METHOD FOR MANUFACTURING SEMICONDUCTOR DEVICE AND SUBSTRATE PROCESSING APPARATUS

BACKGROUND OF THE INVENTION

Field of the Invention

The present invention relates to a method for manufacturing a semiconductor device including a process of processing a substrate, and relates to a substrate processing apparatus.

Description of the Related Art

As one of processes in a manufacturing process of a semiconductor device, there is a thin film formation process of forming a CVD thin film such as a silicon nitride film ($Si_3N_4$ film) or the like, on a substrate such as a semiconductor wafer or the like, with use of a thermal chemical vapor deposition method (thermal CVD method). The thin film formation process using the thermal CVD method is performed by supplying a processing gas to the inside of a processing chamber into which the substrate has been loaded. The purpose of the thin film formation process is to form a thin film on a surface of the substrate. However, practically, a deposited material containing thin films can sometimes be adhered to a portion other than the surface of the substrate, for example, an inner wall of the processing chamber, or the like. Such a deposited material is cumulatively adhered every time when the thin film formation process is performed. When the thickness of the deposited material reaches or exceeds a certain thickness, the deposited material peels from the inner wall, or the like, of the processing chamber, which may cause generation of foreign substances (particles) in the processing chamber. Accordingly, it is necessary to perform cleaning of the inside of the processing chamber and members in the processing chamber by removing the deposited material every time the thickness of the deposited material reaches a certain thickness.

Conventionally, a wet cleaning method of detaching a reaction tube constituting the processing chamber from the substrate processing apparatus, and then removing a deposited material adhered to the inner wall of the reaction tube is removed in a washing tank containing HF (hydrogen fluoride) aqueous solution, as a mainstream method of removing a deposited material. However, recently, use of a dry cleaning method which does not require detaching the reaction tube has been increasing. For example, a dry cleaning method of supplying a gas mixture in which HF (hydrogen fluoride) gas or $H_2$ (hydrogen) gas has been added to $F_2$ (fluorine) gas is supplied to the inside of the processing chamber and other methods are known (for example, see Japanese Patent Application Laid-open No. 2005-277302, Japanese Patent Application Laid-open No. 2005-317920, and Japanese Patent Application Laid-open No. 2007-113778).

However, when the above-described dry cleaning is performed, the film formation speed (film formation rate) is sometimes decreased in the thin film formation process which is immediately after the dry cleaning. In order to prevent decrease in the film formation rate, a method is also conceivable which makes the inner wall, or the like, of the processing chamber flat by supplying the inside of the processing chamber with a gas mixture in which HF gas or $H_2$ gas has been added to $F_2$ gas immediately after the dry cleaning. However, in this method, the HF gas which has been added, or HF gas generated by the reaction of $F_2$ gas and $H_2$ gas sometimes causes metallic contamination due to corrosion of a metal member in the processing chamber or breakage of a quartz member in the processing chamber due to erosion.

SUMMARY OF THE INVENTION

Therefore, it is an object of the present invention to provide a method for manufacturing a semiconductor device, and a substrate processing apparatus, enabling suppressing metallic contamination in a processing chamber and breakage of a quartz member, while suppressing decrease in a film formation rate in a thin film formation process which is immediately after the dry cleaning of the inside of the processing chamber.

According to one aspect of the present invention, a method for manufacturing a semiconductor device is provided. The method includes the steps of: loading a substrate into a processing chamber; performing a processing of forming a thin film on the substrate by supplying a processing gas to an inside of the processing chamber heated to a processing temperature; unloading the processed substrate out of the processing chamber; and cleaning the inside of the processing chamber by supplying a cleaning gas to the inside of the processing chamber, in a state where the substrate is not present in the processing chamber. The step of cleaning the inside of the processing chamber includes the steps of: removing the thin film deposited on the inside of the processing chamber by supplying a fluorine gas solely or a fluorine gas diluted by an inert gas solely, as the cleaning gas, to the inside of the processing chamber heated to a first temperature; and removing an adhered material remaining on the inside of the processing chamber after removing the thin film by supplying a fluorine gas solely or a fluorine gas diluted by the inert gas solely, as the cleaning gas, to the inside of the processing chamber heated to a second temperature.

According to another aspect of the present invention, a method for manufacturing a semiconductor device is provided. The method includes the steps of: loading a substrate into a processing chamber composed of a member including a quartz member and a metal member; performing a processing of forming a silicon nitride film on the substrate by supplying a processing gas to an inside of the processing chamber; unloading the processed substrate out of the processing chamber; and cleaning the inside of the processing chamber by supplying a cleaning gas to the inside of the processing chamber, in a state where the substrate is not present in the processing chamber. The step of cleaning the inside of the processing chamber includes the steps of: removing the silicon nitride film deposited on the inside of the processing chamber by supplying a fluorine gas solely or a fluorine gas diluted by an inert gas solely, as the cleaning gas, to the inside of the processing chamber in which a temperature is set to not less than 350° C. and not more than 450° C. and a pressure is set to not less than 6650 Pa and not more than 26600 Pa; and removing an adhered material including a quarts powder remaining on the inside of the processing chamber after removing the silicon nitride film by supplying a fluorine gas solely or a fluorine gas diluted by the inert gas solely, as the cleaning gas, to the inside of the processing chamber in which a temperature is set to not less than 400° C. and not more than 500° C. and a pressure is set to not less than 6650 Pa and not more than 26600 Pa.

According to a still another aspect of the present invention, a substrate processing apparatus is provided. The substrate processing apparatus includes: a processing chamber for performing a processing of forming a thin film on a substrate; a processing gas supply system for supplying a processing gas to an inside of the processing chamber; a cleaning gas supply system for supplying a cleaning gas to the inside of the processing chamber; a heater for heating the inside of the processing chamber; and a controller for controlling the heater, the processing gas supply system, and the cleaning gas supply system, so as to, when performing the processing on the substrate in the processing chamber, perform the processing of forming a thin film on the substrate by supplying a processing gas to the inside of the processing chamber while heating the inside of the processing chamber to a processing temperature; and so as to, when cleaning the inside of the processing chamber, remove the thin film deposited on the inside of the processing chamber by supplying a fluorine gas solely or a fluorine gas diluted by an inert gas solely, as the cleaning gas, to the inside of the processing chamber while heating the inside of the processing chamber to a first temperature, and subsequently remove an adhered material remaining on the inside of the processing chamber after removing the thin film by supplying a fluorine gas solely or a fluorine gas diluted by an inert gas solely, as the cleaning gas, to the inside of the processing chamber while heating the inside of the processing chamber to a second temperature, in a state where the substrate is not present in the processing chamber.

The method for manufacturing a semiconductor device and the substrate processing apparatus according to the present invention enable suppressing metallic contamination in the processing chamber and erosion of the quartz members while suppressing decrease in film formation rate in the thin film formation process immediately after dry cleaning of the inside of the processing chamber, and enhancing the operation rate of the substrate processing apparatus.

BRIEF DESCRIPTION OF THE DRAWINGS

FIG. 6A is a graph chart showing temperature dependence of an etching rate of silicon nitride film, an etching rate of quartz, and a selection ratio, respectively, and FIG. 6B is a table chart shows a data on which FIG. 6A is based.

FIG. 11A is a schematic view illustrating a change of a quartz surface in the case where a treatment process is not performed after a thin film etching process, and FIG. 11B is a schematic view illustrating a change of a quartz surface in the case where a treatment process is performed after a thin film etching process.

DETAILED DESCRIPTION OF THE PREFERRED EMBODIMENTS

As described above, a CVD thin film is formed by supplying a processing gas to the inside of the processing chamber into which the substrate has been loaded. Hereinafter, a structure of a general thin film forming apparatus and a thin film formation process will be briefly described respectively.

Figure 1:
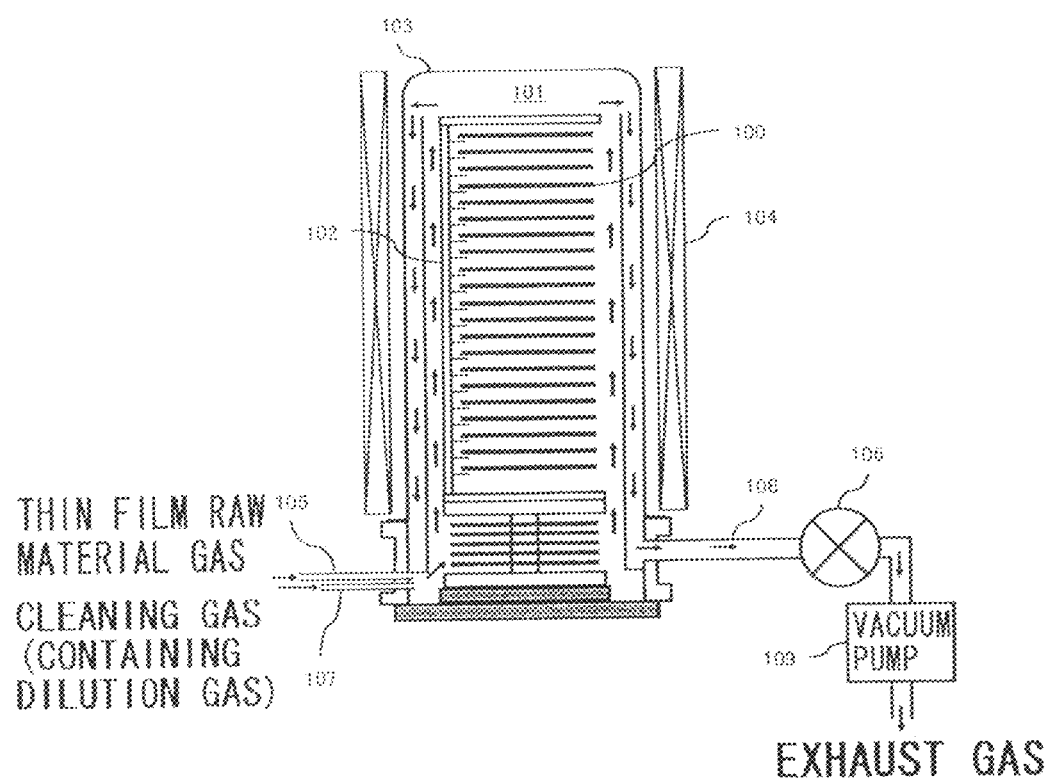
FIG. 1 is a schematic view of a general CVD thin film formation apparatus for a semiconductor.

The structure of a general CVD thin film formation apparatus for a semiconductor will be described with reference to FIG. 1. This thin film forming apparatus includes: a reaction tube 103 which includes therein a film formation chamber (processing chamber) 101 for processing substrates 100; a boat 102 for holding in multiple stages the substrates 100 in a horizontal posture in the film formation chamber 101, a heat source 104 located around the reaction tube 103; a processing gas supply line 105 for supplying the inside of the film formation chamber 101 with a processing gas for forming a CVD thin film; a cleaning gas supply line 107 for supplying a cleaning gas for removing a deposited material by etching it to the inside of the film formation chamber 101; an exhaust line 108 in which a pressure adjustment valve 106 for adjusting a pressure in the film formation chamber 101 and a vacuum pump 109 downstream thereof are provided. The reaction tube 103 and the boat 102 are made of quartz ($SiO_2$).

Subsequently, the thin film formation process performed by this thin film forming apparatus will be described. First, the boat 102 holding a plurality of the substrates 100 is loaded to the inside of the film formation chamber 101. Next, a surface of the substrate 100 is heated to a predetermined temperature by the heat source 104. Subsequently, while the inside of the film formation chamber 101 is evacuated by the exhaust line 108, processing gas is supplied to the inside of the film formation chamber 101 by the processing gas supply line 105, and a thin film is formed on the substrate 100 according to the CVD (Chemical Vapor Deposition) reaction. At this time, the pressure in the film formation chamber 101 is adjusted so as to be kept at a constant pressure by the pressure adjustment valve 106 provided in the exhaust line 108. When a thin film with a predetermined film thickness is formed on the substrate 100, supply of processing gas from the processing gas supply line 105 is stopped. Next, the temperature of the substrate 100 after the thin film is formed is decreased to a predetermined temperature, and subsequently the boat 102 is unloaded to the outside of the film formation chamber 101.

The intended objective of the above-described thin film formation process is to form a thin film on the substrate 100. However, practically, when the thin film is formed on the substrate 100, a deposited material containing the thin film can sometimes also be adhered to an inner wall of the film formation chamber 101 and a member such as the boat 102, or the like. Such deposited material is cumulatively adhered every time the above-described thin film formation process is performed, and when the thickness thereof reaches or exceeds a certain thickness the deposited material peels off or drops, which can lead to generation of foreign substances on the substrate 100. Therefore, it is necessary to remove the deposited material every time the thickness of the deposited material reaches a certain thickness.

As a method of removing the deposited material, there are known the wet cleaning method of detaching the reaction tube 103 and immersing it in a washing solution containing HF aqueous solution, thereby to remove a deposited material by means of wet etching, and the dry cleaning method of supplying an etching gas (cleaning gas) to the inside of the film formation chamber 101, thereby to remove a deposited material by means of dry etching. Recently, use of the dry cleaning methods which do not require detaching of the reaction tube 103 has started. Hereinafter, the dry cleaning method will be briefly described.

First, the empty boat 102 with the deposited material adhered to the surface thereof is loaded into the film formation chamber 101 with the deposited material adhered to the inside thereof. Next, the inside of the film formation chamber 101 is heated to a predetermined temperature by the heat source 104. Subsequently, while the inside of the film formation chamber 101 is evacuated by the exhaust line 108, a cleaning gas is supplied to the inside of the film formation chamber 101 by the cleaning gas supply line 107, whereby the deposited material adhered to the inside of the film formation chamber 101 or the surface of the boat 102 is removed by the etching reaction between active species generated by degradation of the cleaning gas and the deposited material. At this time, the pressure in the film formation chamber 101 is adjusted so as to be kept at a constant pressure by the pressure adjustment valve 106 provided in the exhaust line 108. After the deposited material in the film formation chamber 101 is removed, supply of the cleaning gas from the cleaning gas supply line 107 is stopped. Next, the seasoning process in the film formation chamber 101 is performed. Specifically, processing gas is supplied to the inside of the film formation chamber 101 into which the substrate 100 has not been loaded, and a thin film is formed (pre-coated) on the inner wall of the film formation chamber 101, whereby the state of the film formation chamber 101 is restored to a state which enables transition to the thin film formation process.

Examples of the cleaning gases include, for example, $NF_3$ (nitrogen trifluoride) gas, $ClF_3$ (chlorine trifluoride) gas, $F_2$ (fluorine) gas, or a gas mixture in which HF (hydrogen fluoride) gas or $H_2$ (hydrogen) gas has been added to either of these gases. Provided that, since it is difficult to thermally decompose $NF_3$ gas at a low temperature not more than 500° C., it is necessary to set the temperature in the film formation chamber 101 to a high temperature not less than 600° C. when $NF_3$ gas is used as an etching gas. Accordingly, dry cleaning technologies using $F_2$ gas, $CF_3$ gas, or HF gas are being developed. In particular, $F_2$ gas is strongly reactive and the etching reaction thereof easily develops. Therefore, addition of HF gas to $F_2$ gas can further promote the etching reaction. Japanese Patent Application Laid-open No. 2005-277302 discloses the dry cleaning method of changing the temperature in the film formation chamber 101 in stages with use of a gas mixture of $F_2$ gas and HF gas, or the dry cleaning method of maintaining the temperature in the film formation chamber 101 constantly or changing it in stages, thereby to switch the cleaning gas from the gas mixture in which HF gas has been added to $F_2$ gas to $F_2$ gas. These methods enable preventing a remaining adhered material from being left in the film formation chamber 101 and suppressing generation of foreign substances.

However, when a dry cleaning using the gas mixture of $F_2$ gas and HF gas is performed, the film formation rate can be sometimes decreased in the thin film formation process which is immediately after the dry cleaning. The decrease in the film formation rate is presumed to be caused by an increased effective surface area of the surfaces of quartz members (the reaction tube 103 and the boat 102), due to minute quartz powders remaining on and adhered to the surfaces of the quartz members in the film formation chamber 101 after the cleaning, and due to cracks on the surfaces of the quartz members because of cumulative film formations.

As a method to prevent the decrease in the film formation rate, Japanese Patent Application Laid-open No. 2005-317920 discloses the method of supplying the gas mixture in which HF gas has been added to $F_2$ gas, to the inside of the film formation chamber 101, immediately after the dry cleaning, thereby to make the inner wall of the film formation chamber 101 flat (in other words, to remove quartz cracks generated in the quartz members). Note that, Japanese Patent Application Laid-open No. 2005-317920 clearly states that use of $F_2$ gas solely or HF gas solely can remove little quartz cracks, whereby decrease in the film formation rate is not avoidable.

As another method to prevent the decrease in the film formation rate, Japanese Patent Application Laid-open No. 2007-113778 discloses the method of cleaning the inside of the film formation chamber 101 by supplying, the cleaning gas in which $H_2$ gas has been added to $F_2$ gas, to the inside of the film formation chamber 101, and subsequently, supplying a flattening gas in which $H_2$ gas has been added to $F_2$ gas, to the inside of the film formation chamber 101, so as to make the inner wall of the film formation chamber 101 flat (in other words, to remove quartz cracks generated in the quartz members). Note that, Japanese Patent Application Laid-open No. 2007-113778 clearly states that it is necessary to add $H_2$ gas to the cleaning gas and that the flattening gas should preferably contain a small amount of $H_2$ gas.

However, when the gas mixture in which HF gas has been added to $F_2$ gas is supplied to the inside of the film formation chamber 101 immediately after the dry cleaning (in other words, when HF gas is directly supplied to the inside of the film formation chamber 101), metallic contamination can sometimes occur because metal members in the film formation chamber 101 are corroded by the HF gas which has been supplied, or the quartz member can break because of a significant erosion of quartz caused by multilayered HF adsorbed on the quartz member at a low-temperature portion of the film formation chamber 101. Furthermore, when the gas mixture in which $H_2$ gas has been added to $F_2$ gas is supplied to the inside of the film formation chamber 101, HF gas can be generated in the film formation chamber 101 by the reaction between $F_2$ gas and $H_2$ gas, which can lead not only to the above-described metallic contamination and breakage of the quartz members, but also to a risk of explosion in the film formation chamber 101 under some conditions.

Therefore, the inventors and the like have made earnest researches on the method which suppresses metallic contamination and breakage of the quartz members in the film formation chamber 101, while suppressing decrease in the film formation rate in the thin film formation process which is immediately after the dry cleaning in the film formation chamber 101. As a result, the inventors have acquired the knowledge that the above-described problem can be solved by supplying $F_2$ gas solely or $F_2$ gas diluted by an inert gas solely to the inside of the film formation chamber 101, while optimizing the temperature conditions. Specifically, the inventors have acquired the knowledge that the above-described problem can be solved by the step of removing the thin film deposited on the inside of the processing chamber by supplying $F_2$ gas solely or $F_2$ gas diluted by an inert gas solely, as the cleaning gas, to the inside of the processing chamber heated to a first temperature; and the step of removing an adhered material remaining on the inside of the processing chamber after removing the thin film by supplying $F_2$ gas solely or $F_2$ gas diluted by an inert gas solely, as the cleaning gas, to the inside of the processing chamber heated to a second temperature. The present invention has been made based on the knowledge acquired by the inventors.

Hereinafter, one embodiment of the present invention will be described.

1. The Structure of the Substrate Processing Apparatus

Figure 7:
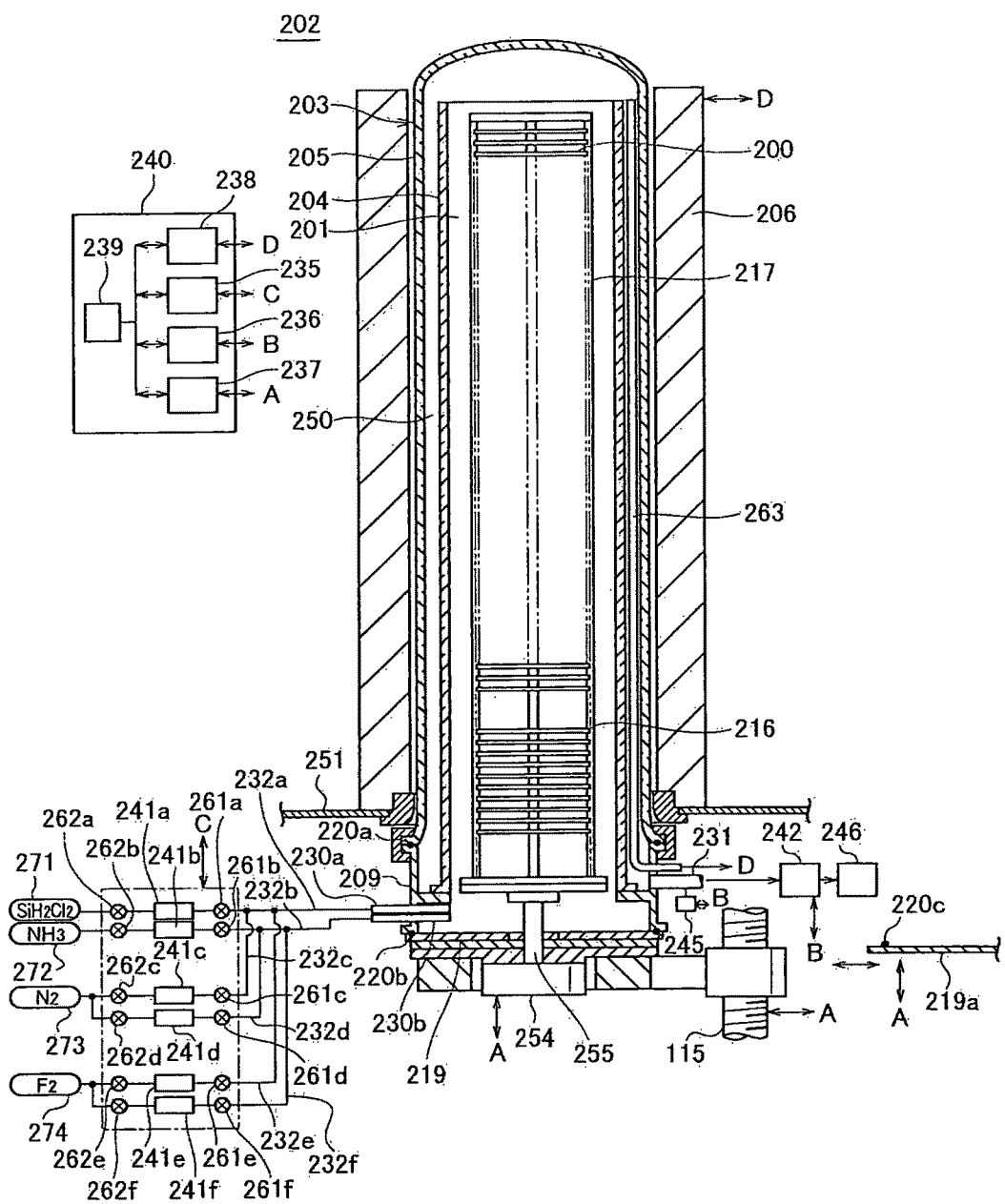
FIG. 7 is a schematic view of a processing furnace of a substrate processing apparatus which is preferably used in one embodiment of the present invention.

First, the structure of a substrate processing apparatus according to the present embodiment will be described with reference to the drawings. FIG. 7 is a schematic structural view, shown as a longitudinal sectional view, of a processing furnace 202 of a substrate processing apparatus which is preferably used in the present embodiment.

As shown in FIG. 7, the processing furnace 202 includes a heater 206 which serves as the heating mechanism. The heater 206, having a cylindrical shape, is installed vertically by being supported by a heater base 251 which serves as the holding plate.

Inside the heater 296, a process tube 203 which serves as the reaction tube is arranged concentrically with the heater 206. The process tube 203 includes an inner tube 204 which serves as the inner reaction tube, and an outer tube 205 which serves as the outer reaction tube provided outside thereof. The inner tube 204 is made of, for example, a heat-resistant material such as quartz ($SiO_2$), silicon carbide (SiC) or the like, and formed into a cylindrical shape with upper and lower ends thereof being opened. A processing chamber 201 for performing a processing of forming a thin film on wafers 200 which serve as the substrates is formed in a cylindrical hollow portion of the inner tube 204. The processing chamber 201 is configured to accommodate the wafers 200 in a state where the wafers 200 in a horizontal posture are aligned in multiple stages in the vertical direction by means of a boat 217 to be described later. The outer tube 205 is made of, for example, a heat-resistant material such as quartz, silicon carbide or the like, has been formed into a cylindrical shape, with an inner diameter thereof being larger than an outer diameter of the inner tube 204, and with an upper end thereof being closed and a lower end thereof being opened, and is provided concentrically with the inner tube 204.

A manifold 209 is arranged concentrically with the outer tube 205 below the outer tube 205. The manifold 209 is made of, for example, stainless steel or the like, and has been formed into a cylindrical shape with upper and lower ends thereof being opened. The manifold 209, engaged with the inner tube 204 and the outer tube 205, is provided so as to support them. Note that, an O ring 220a which serves as the sealing member is provided between the manifold 209 and the outer tube 205. The process tube 203 is installed vertically by the manifold 209 being supported by the heater base 251. A reaction container is formed by the process tube 203 and the manifold 209.

The manifold 209 is connected to nozzles 230a, 230b which serve as the gas introduction portions, such that they are communicated with the inside of the processing chamber 201. Processing gas supply tubes 232a, 232b which supply a processing gas for forming a thin film to the inside of the processing chamber 201 are connected to the nozzles 230a, 230b, respectively. An $SiH_2Cl_2$ (DCS) gas supply source 271 which serves as the first processing gas supply source is connected, via an MFC (mass flow controller) 241a which serves as the gas flow rate controller, to the processing gas supply tube 232a, at the upstream side thereof opposite to the side connected to the nozzle 230a. Valves 262a, 261a are respectively provided in the processing gas supply tube 232a at the upstream and downstream of the MFC 241a. An $NH_3$ gas supply source 272 which serves as the second processing gas supply source is connected, via an MFC (mass flow controller) 241b which serves as the gas flow rate controller, to the processing gas supply tube 232b at the upstream side thereof opposite to the side connected to the nozzle 230b. Valves 262b, 261b are respectively provided in the processing gas supply tube 232b at the upstream and downstream of the MFC 241b. A processing gas supply system is constituted mainly by the processing gas supply tubes 232a, 232b, the MFCs 241a, 241b, the valves 262a, 261a, 262b, and 261b, the $SiH_2Cl_2$ gas supply source 271, and the $NH_3$ gas supply source 272.

Inert gas supply tubes 232c, 232d are connected to the processing gas supply tubes 232a, 232b at the downstream of the valves 261a, 261b, respectively. An $N_2$ gas supply source 273 which serves as the inert gas supply source is connected, via an MFC (mass flow controller) 241c which serves as the gas flow rate controller, to the inert gas supply tube 232c at the upstream side thereof opposite to the side connected to the processing gas supply tube 232a. Valves 262c, 261c are respectively provided in the inert gas supply tube 232c at the upstream and downstream of the MFC 241c, respectively. The $N_2$ gas supply source 273 which serves as the second processing gas supply source is connected, via an MFC (mass flow controller) 241d which serves as the gas flow rate controller, to the inert gas supply tube 232d at the upstream side thereof opposite to the connection side with the processing gas supply tube 232b. Exactly speaking, the inert gas supply tube 232d at the upstream side thereof is connected to the inert gas supply tube 232c at the upstream of the valves 262c, and the inert gas supply tube 232d is provided so as to branch from the inert gas supply tube 232c at the upstream of the valve 262c. An inert gas supply system is constituted mainly by the inert gas supply tubes 232c, 232d, the MFCs 241c, 241d, the valves 262c, 261c, 262d, and 261d, and the $N_2$ gas supply source 273. Note that, the inert gas supply system also has a function of diluting a processing gas or a cleaning gas, and the inert gas supply system also constitutes a part of the processing gas supply system and a part of the cleaning gas supply system. In addition, the inert gas supply system also functions as a purge gas supply system.

Cleaning gas supply tubes 232e, 232f which supply a cleaning gas for cleaning the inside of the processing chamber 201 to the inside of the processing chamber 201 are respectively connected to the processing gas supply tubes 232a, 232b, at the downstream of the valves 261a, 261b, and at further downstream of connecting portions with the inert gas supply tubes 232c, 232d. An $F_2$ gas supply source 274 which serves as the cleaning gas supply source is connected, via an MFC (mass flow controller) 241e which serves as the gas flow rate controller, to the cleaning gas supply tube 232e at the upstream side thereof opposite to the side connected to the processing gas supply tube 232a. Valves 262e, 261e are respectively provided in the cleaning gas supply tube 232e at the upstream and downstream of the MFC 241e. The $F_2$ gas supply source 274 which serves as the cleaning gas supply source is connected, via an MFC (mass flow controller) 241f which serves as the gas flow rate controller, to the cleaning gas supply tube 232f at the upstream side thereof opposite to the side connected to the processing gas supply tube 232b. Exactly speaking, the cleaning gas supply tube 232f at the upstream side thereof is connected to the cleaning gas supply tube 232e at the upstream of the valve 262e, and the cleaning gas supply tube 232f is provided so as to branch from the cleaning gas supply tube 232e at the upstream of the valve 262e. Valves 262f, 261f are respectively provided in the cleaning gas supply tube 232f at the upstream and downstream of the MFC241f. A cleaning gas supply system is constituted mainly by the cleaning gas supply tubes 232e, 232f the MFCs 241e, 241f, the valves 262e, 261e, 262f, and 261f, and the $F_2$ gas supply source 274.

A gas supplying and flow rate controlling portion 235 is electrically connected to the MFCs 241a, 241b, 241c, 241d, 241e, and 241f, and the valves 261a, 261b, 261c, 261d, 261e, 261f, 262a, 262b, 262c, 262d, 262e, and 262f. The gas supplying and flow rate controlling portion 235 is configured to control the MFCs 241a, 241b, 241c, 241d, 241e, and 241f, and the valves 261a, 261b, 261c, 261d, 261e, 261f, 262a, 262b, 262c, 262d, 262e, and 262f at desired timings, such that the type of the gas to be supplied to the inside of the processing chamber 201 in individual steps, which will be described later, is a desired gas type, such that the flow rate of the gas to be supplied is a desired flow rate, and such that the concentration of the gas to be supplied is a desired concentration.

The manifold 209 is provided with an exhaust pipe 231 which exhausts atmosphere in the processing chamber 201. The exhaust pipe 231, which is located at a lower end portion of a cylindrical space 250 formed by a clearance between the inner tube 204 and the outer tube 205, is communicated with the cylindrical space 250. A vacuum exhaust unit 246, such as a vacuum pump, is connected, via a pressure sensor 245 which serves as the pressure detector, and a pressure adjustment unit 242, such as a variable conductance valve, for example, APC (Auto Pressure Controller) valve or the like, to the exhaust pipe 231 at the downstream thereof opposite to the side connected to the manifold 209. The vacuum exhaust unit 246 is configured to be capable of vacuum evacuation such that the pressure in the processing chamber 201 becomes a predetermined pressure (degree of vacuum). A pressure controller 236 is electrically connected to the pressure adjustment unit 242 and the pressure sensor 245. The pressure controller 236 is configured to control the pressure adjustment unit 242 at desired timings on the basis of the pressure detected by the pressure sensor 245, such that the pressure in the processing chamber 201 becomes a desired pressure. An exhaust system is constituted mainly by the exhaust pipe 231, the pressure adjustment unit 242, and the vacuum exhaust unit 246.

A seal cap 219 which serves as the first furnace opening cover body and enables closing a lower end opening of the manifold 209 in an air tight manner below the manifold 209. The seal cap 219 is configured to abut with the lower end of the manifold 209 upward in the vertical direction. The seal cap 219, which is made of, for example, a metal such as stainless steel, is formed into a disk shape. An O ring 220b, serving as the sealing member and abutting with the lower end of the manifold 209, is provided on a top surface of the seal cap 219. A rotation mechanism 254 for rotating the boat is mounted to the seal cap 219 on the opposite side of the side of the processing chamber 201. A rotational axis 255 of the rotation mechanism 254, passing through the seal cap 219, is connected to the boat 217 which will be described later, and configured so as to rotate the wafers 200 by rotating the boat 217. The seal cap 219 is configured to be raised and lowered in the vertical direction by a boat elevator 115 which serves as the raising and lowering mechanism and which is installed vertically to the outside of the process tube 203. This configuration enables the boat 217 to be loaded to and unloaded from the processing chamber 201. A drive controller 237 is electrically connected to the rotation mechanism 254 and the boat elevator 115. The drive controller 237 is configured to control the rotation mechanism 254 and the boat elevator 115 at desired timings such that they perform desired operations. In addition, a furnace opening shutter 219a, which serves as the second furnace opening cover body and which enables closing the lower end opening of the manifold 209 in an air tight manner, is provided below the manifold 209. The shutter 219a is configured to be raised/lowered and rotated so as to abut with the lower end of the manifold 209, after the boat 217 is unloaded from the inside of the processing chamber 201, and to close the inside of the processing chamber 201 in an air tight manner after the boat 217 is unloaded. An O ring 220c, which serves as the sealing member and which abuts with the lower end of the manifold 209, is provided on a top surface of the shutter 219a.

The boat 217, which serves as the substrate holder, is made of, for example, a heat-resistant material, such as, quartz, silicon carbide or the like. The boat 217 is configured to hold, in multiple stages, a plurality of the wafers 200 which are aligned in a horizontal posture with the centers thereof being matched. Note that, a plurality of disk-shaped heat insulation boards 216, which serve as the heat insulating members and are made of, for example, a heat-resistant material, such as, quartz, silicon carbide or the like, are arranged in multiple stages in a horizontal posture at a lower portion of the boat 217. The heat insulation boards 216 are configured to make it difficult for heat from the heater 206 to be transmitted to the manifold 209 side.

A temperature sensor 263 which serves as the temperature detector is mounted in the process tube 203. A temperature controller 238 is electrically connected to the heater 206 and the temperature sensor 263. The temperature controller 238 is configured to control the conductivity status to the heater 206 at desired timings on the basis of the temperature information detected by the temperature sensor 263, such that the processing chamber 201 has a desired temperature distribution.

The gas supplying and flow rate controlling portion 235, the pressure controller 236, the drive controller 237, and the temperature controller 238, which also constitute an operation portion and an input/output portion, are electrically connected to a main controller 239 which controls the entire substrate processing apparatus. A controller 240 is configured by the gas supplying and flow rate controlling portion 235, the pressure controller 236, the drive controller 237, the temperature controller 238, and the main controller 239.

(2) The Thin Film Formation Method

Next, as one of the processes for manufacturing a semiconductor device, the method of forming a thin film on each wafer 200 in the processing chamber 201 according to the CVD method, and the method of cleaning the inside of the processing chamber 201, both of which use the processing furnace 202 according to the above-described structure, will be described. Note that, in the description hereinafter, the operations of the individual portions that constitute the substrate processing apparatus are controlled by the controller 240.

When the boat 217 is charged with a plurality of the wafers 200 (wafer charge), then as shown in FIG. 7, the boat 217 which holds a plurality of the wafers 200 is raised by the boat elevator 115 and loaded to the inside of the processing chamber 201 (boat load). In this state, the seal cap 219 seals the lower end of the manifold 209 via the O ring 220b.

The processing chamber 201 is vacuum evacuated by the vacuum exhaust unit 246, such that the pressure therein becomes a desired pressure (degree of vacuum). At this time, the pressure in the processing chamber 201 is measured by the pressure sensor 245, and the pressure adjustment unit 242 is feed-back controlled on the basis of the measured pressure. In addition, the processing chamber 201 is heated by the heater 206, such that the temperature therein becomes a desired temperature. At this time, the conductivity status to the heater 206 is feed-back controlled on the basis of the temperature information detected by the temperature sensor 263, such that the processing chamber 201 has a desired temperature distribution. Subsequently, the boat 217 is rotated by the rotation mechanism 254, whereby the wafers 200 are rotated.

Subsequently, $SiH_2Cl_2$ gas as the first processing gas and $NH_3$ gas as the second processing gas are supplied to the inside of the processing chamber 201 from the $SiH_2Cl_2$ gas supply source 271 as the first processing gas supply source and the $NH_3$ gas supply source 272 as the second processing gas supply source, respectively, in a state where the temperature and the pressure in the processing chamber 201 are maintained to a desired temperature and pressure, respectively. Specifically, $SiH_2Cl_2$ gas and $NH_3$ gas are supplied, from the $SiH_2Cl_2$ gas supply source 271 and the $NH_3$ gas supply source 272, to the inside of the processing gas supply tubes 232a, 232b, respectively, by the valves 262a, 261a, 262b, and 261b being opened. $SiH_2Cl_2$ gas and $NH_3$ gas are controlled by the MFCs 241a, 241b, respectively, so as to have desired flow rates, then pass through the processing gas supply tubes 232a, 232b, respectively, and are introduced via the nozzles 230a, 230b, respectively, to the inside of the processing chamber 201.

At this time, $N_2$ gas may be supplied from the $N_2$ gas supply source 273 as the inert gas supply source to the inside of the processing chamber 201 simultaneously, so as to dilute processing gas ($SiH_2Cl_2$ gas, $NH_3$ gas). In this case, for example, $N_2$ gas is supplied from $N_2$ gas supply source 273 to the inside of the inert gas supply tubes 232c, 232d by the valves 262c, 261c, 262d, and 261d being opened. $N_2$ gas is controlled by the MFC241c, 241d so as to have desired flow rates. Subsequently, $N_2$ gas passes through the inert gas supply tubes 232c, 232d, via the processing gas supply tubes 232a, 232b, and is introduced via the nozzles 230a, 230b to the inside of the processing chamber 201. $N_2$ gas is mixed with $SiH_2Cl_2$ gas and $NH_3$ gas in the processing gas supply tubes 232a, 232b, respectively. The concentration of processing gas can also be controlled by controlling the flow rate of $N_2$ gas supplied.

Processing gas introduced to the inside of the processing chamber 201 goes up inside the processing chamber 201, flows via an upper end opening of the inner tube 204 to the cylindrical space 250, flows down in the cylindrical space 250, and subsequently is exhausted from the exhaust pipe 231. When processing gas passes through the inside of the processing chamber 201, it gets contact with the surfaces of the wafers 200. At this time, a thin film, that is, a silicon nitride ($Si_3N_4$) film is deposited on the surfaces of the wafers 200 by the thermal CVD reaction.

When a processing time which has been set in advance passes, supply of processing gas is stopped. In other words, supplies of $SiH_2Cl_2$ gas and $NH_3$ gas from the $SiH_2Cl_2$ gas supply source 271 and the $NH_3$ gas supply source 272, respectively, to the inside of the processing chamber 201, are stopped by the valves 262a, 261a, 262b, and 261b being closed. Subsequently, $N_2$ gas is exhausted from the exhaust pipe 231 while being supplied from the $N_2$ gas supply source 273 to the inside of the processing chamber 201, by the valves 262c, 261c, 262d, and 261d being opened, whereby the inside of the processing chamber 201 is purged. Next, the atmosphere in the processing chamber 201 is replaced by $N_2$ gas, and the pressure in the processing chamber 201 returns to the normal pressure.

Subsequently, the seal cap 219 is lowered by the boat elevator 115, thereby to open the lower end of the manifold 209. At the same time, the processed wafers 200 are unloaded to the outside of the process tube 203 via the lower end of the manifold 209 in the state where the wafers 200 are held by the boat 217 (boat unload). Subsequently, the processed wafers 200 are taken out from the boat 217 (wafer discharge).

Note that, the processing conditions when processing the wafers 200 in the processing furnace 202 of the present embodiment, for example, in formation of a silicon nitride film, are as follows:

processing temperature: 650 to 800° C.,
processing pressure: 10 to 500 Pa,
$SiH_2Cl_2$ gas supply flow rate: 100 to 500 sccm,
$NH_3$ gas supply flow rate: 500 to 5000 sccm.

The wafers 200 are processed by maintaining each of the processing conditions to a constant value within each specified range.

(3) The Cleaning Method

Next, the method of cleaning the inside of the processing chamber 201 will be described. Note that, in the description hereinafter, the operations of the individual portions that constitute the substrate processing apparatus are controlled by the controller 240.

When the above-described thin film formation process is repeated, thin films, such as silicon nitride films or the like, are accumulated also in the processing chamber 201 such as the inner wall or the like of the process tube 203. In other words, the deposited material containing the thin films is adhered to the inner wall or the like. At the time point when the thickness of the deposited material (accumulated thin films) adhered to the inner wall or the like reaches a predetermined thickness before the deposited material peels off or drops, cleaning of the inside of the processing chamber 201 is performed.

The cleaning is performed by sequentially performing: the step of removing a thin film deposited (accumulated) on the inside of the processing chamber 201 by supplying $F_2$ gas solely or $F_2$ gas diluted by an inert gas solely, as the cleaning gas, to the inside of the processing chamber 201 heated to a first temperature (first step (thin film etching process)); and the step of removing an adhered material remaining in the processing chamber 201 after removing the thin film, by supplying $F_2$ gas solely or $F_2$ gas diluted by an inert gas solely, as the cleaning gas, to the inside of the processing chamber 201 heated to a second temperature (second step (treatment process)). Hereinafter, the first step (thin film etching process) and the second step (treatment process) will be described, respectively.

The First Step (Thin Film Etching Process)

The empty boat 217, that is, the boat 217 which is not charged with the wafers 200, is raised by the boat elevator 115 and loaded to the inside of the processing chamber 201 (boat load). In this state, the seal cap 219 seals the lower end of the manifold 209 via the O ring 220b.

The processing chamber 201 is vacuum evacuated by the vacuum exhaust unit 246, such that the pressure therein becomes a desired pressure (degree of vacuum), that is, the first pressure. At this time, the pressure in the processing chamber 201 is measured by the pressure sensor 245, and the pressure adjustment unit 242 is feed-back controlled on the basis of the measured pressure. In addition, the processing chamber 201 is heated by the heater 206, such that the temperature therein becomes a desired temperature, that is, the first temperature. At this time, the conductivity status to the heater 206 is feed-back controlled on the basis of the temperature information detected by the temperature sensor 263, such that the processing chamber 201 has a desired temperature distribution. When the pressure and the temperature in the processing chamber 201 reach the first pressure and the first temperature, respectively, control is performed so as to maintain the pressure and the temperature. Subsequently, the boat 217 is rotated by the rotation mechanism 254. Meanwhile, the boat 217 need not be rotated.

Subsequently, $F_2$ gas as the cleaning gas is supplied from the $F_2$ gas supply source 274 as the cleaning gas supply source to the inside of the processing chamber 201, in the state where the temperature and the pressure in the processing chamber 201 are maintained at the first temperature and the first pressure, respectively. Specifically, $F_2$ gas is supplied from the $F_2$ gas supply source 274 to the inside of the cleaning gas supply tubes 232e, 232f, by the valves 262e, 261e, 262f, and 261f being opened. $F_2$ gas is controlled by the MFCs 241e, 241f so as to have desired flow rates, and then passes through the cleaning gas supply tubes 232e, 232f, and by way of the processing gas supply tubes 232a, 232b, and are introduced via the nozzles 230a, 230b to the inside of the processing chamber 201.

At this time, $N_2$ gas may be supplied from the $N_2$ gas supply source 273 as the inert gas supply source to the inside of the processing chamber 201 simultaneously, so as to dilute $F_2$ gas as the cleaning gas. In this case, for example, $N_2$ gas is supplied from the $N_2$ gas supply source 273 to the inside of the inert gas supply tubes 232c, 232d, respectively, by the valves 262c, 261c, 262d, and 261d being opened. $N_2$ gas is controlled by the MFCs 241c, 241d, respectively so as to have desired flow rates. Subsequently, $N_2$ gas passes through the inert gas supply tubes 232c, 232d, and by way of the processing gas supply tubes 232a, 232b, and are introduced via the nozzles 230a, 230b to the inside of the processing chamber 201. $N_2$ gas is mixed with $F_2$ gas in the processing gas supply tubes 232a, 232b. The concentration of $F_2$ gas can also be controlled by controlling the flow rate of $N_2$ gas supplied.

Note that, if $F_2$ gas or diluted $F_2$ gas is supplied via nozzles for a cleaning gas that are different from the nozzles 230a, 230b for supplying processing gases, then $F_2$ gas or diluted $F_2$ gas may enter the nozzles 230a, 230b, which may give negative influence on the processing gas supply system such as the processing gas supply tubes 232a, 232b, or the like. On the contrary, in the present embodiment, the nozzles 230a, 230b for supplying processing gas are also used as the nozzles for supplying $F_2$ gas or diluted $F_2$ gas. $F_2$ gas or diluted $F_2$ gas passes through the processing gas supply tubes 232a, 232b, and is introduced to the inside of the processing chamber 201 via the nozzles 230a, 230b for supplying processing gas. Accordingly, there is little concern on the negative influence.

$F_2$ gas or diluted $F_2$ gas introduced to the inside of the processing chamber 201 goes up inside the processing chamber 201, flows via the upper end opening of the inner tube 204 to the cylindrical space 250, flows down in the cylindrical space 250, and subsequently, is exhausted from the exhaust pipe 231. When $F_2$ gas or diluted $F_2$ gas passes through the inside of the processing chamber 201, it gets contact with a deposited material containing the thin film such as a silicon nitride film accumulated on the inner wall of the process tube 203 or the surface of the boat 217, when the thin film is removed by the thermo-chemical reaction. Specifically, the thin film is removed by the etching reaction between active species generated by thermal decomposition of $F_2$ gas and the deposited material.

When an etching time of the thin film which has been set in advance passes and the first step (thin film etching process) is completed, then transition to the second step (treatment process) is made. In the treatment process, the adhered material remaining in the processing chamber 201 is removed after the thin film etching process, so as to make the surfaces of the quartz members in the processing chamber 201 smooth. Specifically, adhered materials: such as, quartz cracks generated on the surfaces of the quartz members, such as the process tube 203, the boat 217, or the like; minute quartz powders (quartz powders) generated due to quartz cracks or the like and adhered to the surfaces of the quartz members in the processing chamber 201; a remaining silicon nitride film, or the like, are removed.

The Second Step (Treatment Process)

The processing chamber 201 is vacuum evacuated by the vacuum exhaust unit 246 such that the pressure therein becomes a desired pressure, that is, the second pressure, in the state where the boat 217 which is not charged with the wafers 200 remains loaded to the inside of the processing chamber 201 (boat load). At this time, the pressure in the processing chamber 201 is measured by the pressure sensor 245, and the pressure adjustment unit 242 is feed-back controlled on the basis of the measured pressure. In addition, the processing chamber 201 is heated by the heater 206 so as to have a desired temperature, that is, the second temperature. At this time, the conductivity status to the heater 206 is feed-back controlled on the basis of the temperature information detected by the temperature sensor 263, such that the processing chamber 201 has a desired temperature distribution. When the pressure and the temperature in the processing chamber 201 reach the second pressure and the second temperature, respectively, control so as to maintain the pressure and the temperature is performed.

Note that, it is preferable that the second pressure be equal to the first pressure. In other words, when a transition is made from the first step (thin film etching process) to the second step (treatment process), it is preferable that the pressure in the processing chamber 201 be maintained at a pressure equal to the first pressure without being changed.

Meanwhile, it is preferable that the second temperature be equal to or higher than the first temperature. In other words, when a transition is made from the first step (thin film etching process) to the second step (treatment process), it is preferable that the temperature in the processing chamber 201 be not changed and maintained at a temperature equal to the first temperature, or changed to a temperature which is higher than the first temperature.

If the second pressure is set to a pressure equal to the first pressure and the second temperature is set to a temperature equal to the first temperature, the step of changing the pressure and the temperature in the processing chamber 201 to the second pressure and the second temperature will be eliminated.

Subsequently, $F_2$ gas, as the cleaning gas, is supplied from the $F_2$ gas supply source 274, as the cleaning gas supply source, to the inside of the processing chamber 201, in the state where the temperature and the pressure in the processing chamber 201 are maintained at the second temperature and the second pressure, respectively. Specifically, $F_2$ gas is supplied from the $F_2$ gas supply source 274 to the inside of the cleaning gas supply tubes 232e, 232f, respectively, by the valves 262e, 261e, 262f, and 261f being opened. $F_2$ gas is controlled by the MFCs 241e, 241f respectively so as to have desired flow rates, and then passes through the cleaning gas supply tubes 232e, 232f, and by way of the processing gas supply tubes 232a, 232b, and is introduced via the nozzles 230a, 230b to the inside of the processing chamber 201.

At this time, $N_2$ gas may be supplied from the $N_2$ gas supply source 273 as the inert gas supply source to the inside of the processing chamber 201 simultaneously, so as to dilute $F_2$ gas as the cleaning gas. In this case, for example, $N_2$ gas is supplied from the $N_2$ gas supply source 273 to the inside of the inert gas supply tubes 232c, 232d, respectively, by the valves 262c, 261c, 262d, and 261d being opened. $N_2$ gas is controlled by the MFCs 241c, 241d so as to have desired flow rates, and then passes through the inert gas supply tubes 232c, 232d, and by way of the processing gas supply tubes 232a, 232b, and is introduced via the nozzles 230a, 230b to the inside of the processing chamber 201. $N_2$ gas is mixed with $F_2$ in the processing gas supply tubes 232a, 232b. The concentration of $F_2$ gas can also be controlled by controlling the flow rate of $N_2$ gas supplied.

Note that, when a transition is made from the first step (thin film etching process) to the second step (treatment process), the valves 262e, 261e, 262f, and 261f, and the valves 262c, 261c, 262d, and 261d may be kept opened so as to maintain supply of $F_2$ gas or diluted $F_2$ gas to the inside of the processing chamber 201.

$F_2$ gas or diluted $F_2$ gas introduced to the inside of the processing chamber 201 goes up inside the processing chamber 201, flows via the upper end opening of the inner tube 204 to the cylindrical space 250, flows down in the cylindrical space 250, and subsequently, is exhausted from the exhaust pipe 231. When $F_2$ gas or diluted $F_2$ gas passes through the inside of the processing chamber 201, it gets contact with the adhered materials, such as, minute quartz powders adhered to the inside of the processing chamber 201, and remaining silicon nitride films, and with the surfaces of the quartz members (such as the process tube 203, the boat 217, or the like) in the processing chamber 201, or the like. At this time, the adhered materials, such as quartz powders, the remaining silicon nitride films, or the like, are removed by the thermo-chemical reaction, and the surfaces of the quartz members in the processing chamber 201 are made smooth by being etched slightly. Specifically, the adhered materials are removed by the etching reaction between active species generated by thermal decomposition of $F_2$ gas with the adhered materials, and between active species and the surfaces of the quartz member, whereby the surfaces of the quartz members are made smooth.

When the processing time which has been set in advance passes and thus the second step (treatment process) is completed, supply of $F_2$ gas is stopped. In other words, supply of $F_2$ gas from the $F_2$ gas supply source 274 to the inside of the processing chamber 201 is stopped, by the valves 262e, 261e, 262f, and 261f being closed. Subsequently, the valves 262c, 261c, 262d, and 261d are opened, and then $N_2$ gas is exhausted from the exhaust pipe 231 while being supplied from the $N_2$ gas supply source 273 to the inside of the processing chamber 201, whereby the inside of the processing chamber 201 is purged. Next, the atmosphere in the processing chamber 201 is replaced by $N_2$ gas, and the pressure in the processing chamber 201 returns to the normal pressure.

Note that, the conditions for etching a thin film in the first step (thin film etching process) are exemplified as follows:
first temperature: 350 to 450° C.,
first pressure: 6650 Pa (50 Torr) to 26600 Pa (200 Torr), preferably not less than 13300 Pa (100 Torr) and not more than 19950 Pa (150 Torr),
$F_2$ gas supply flow rate: 0.5 to 5 slm,
$N_2$ gas supply flow rate: 1 to 20 slm.
Etching of a thin film is performed by maintaining each of the etching conditions to a constant value within each specified range.

Meanwhile, the processing conditions in the second step (treatment process) are exemplified as follows:
second temperature: 400 to 500° C.,
second pressure: 6650 Pa (50 Torr) to 26600 Pa (200 Torr), preferably not less than 13300 Pa (100 Torr) and not more than 19950 Pa (150 Torr),
$F_2$ gas supply flow rate: 0.5 to 5 slm,
$N_2$ gas supply flow rate: 1 to 20 slm
Processing is performed by maintaining each of the processing to a constant value within each specified range.

When the cleaning step, that is, the first step (thin film etching process) and the second step (treatment process) is completed, the thin film formation process will be resumed.

Figure 6:
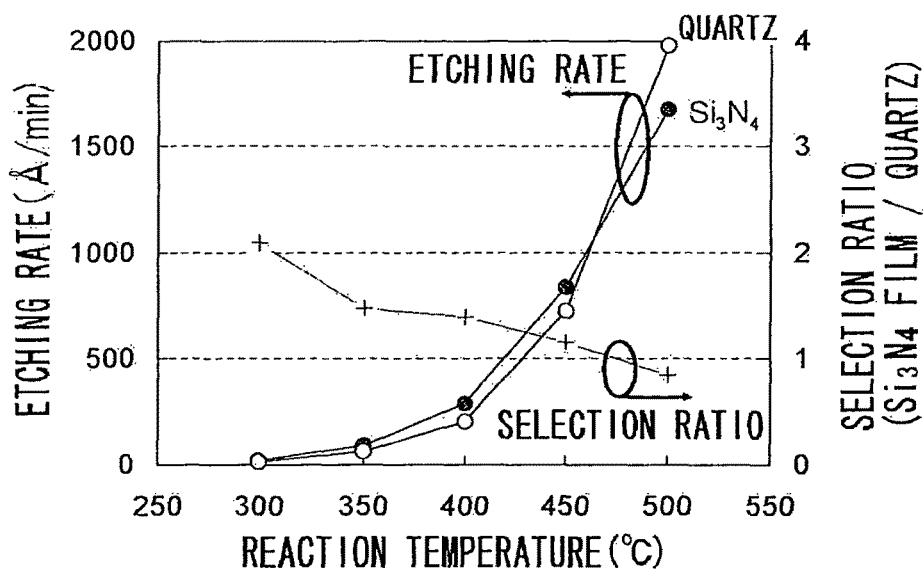

(4) Verification, Consideration, and Advantageous Effects of the Cleaning Method According to the Present Embodiment FIG. 6 shows the results of verification on the temperature dependency of the etching rate and the selection ratio in the cleaning method according to the present embodiment.

FIG. 6A is a graph showing temperature dependency of an etching rate of silicon nitride film, an etching rate of quartz, and a selection ratio (the etching rate of silicon nitride film/the etching rate of quartz), respectively. FIG. 6B is a table showing the data on which the graph is based. In FIG. 6A, the left vertical axis shows the etching rates of silicon nitride film and quartz (Å/min), and the right vertical axis shows the selection ratio (the etching rate of silicon nitride film/the etching rate of quartz). The horizontal axis shows the temperature in the processing chamber 201. In the graphs, black dots show the etching rates of silicon nitride film, and white dots show the etching rates of quartz, and the "+" marks show the selection ratios. A silicon nitride film subject to etching was formed under the processing conditions in the range exemplified in the above-described embodiment. Etching was performed by changing the temperature to 300° C., 350° C., 400° C., 450° C., and 500° C. Other etching conditions than temperature were set to: pressure: 100 Torr, $F_2$ flow rate: 2 slm, the $N_2$ flow rate: 8 slm, and $F_2$ concentration $(F_5/(F_2+N_2))$: 20%.

It is found from FIG. 6 that both the etching rate of silicon nitride film and the etching rate of quartz increase as the temperature increases, and that, on the contrary, the selection ratio decreases as the temperature increases.

It is also found that, etching of silicon nitride hardly progresses at a temperature of approx. 300° C., and that it sufficiently advances at a temperature not less than 350° C. enabling a silicon nitride film to be etched at an adequate etching rate.

It is found from that, etching of quartz does not progress much at a temperature less than 400° C., such as 300° C., 350° C., or the like, and that it sufficiently advances at a temperature not less than 400° C. and not more than 450° C., enabling quartz to be etched at an adequate etching rate, although the etching rate of quartz is lower than the etching rate of silicon nitride film.

In addition, at 450° C., the selection ratio is approx. 1 (1.2) and the etching rate of silicon nitride film is substantially equal to the etching rate of quartz. Based on this, it is found that silicon nitride film and quartz are etched equally.

In addition, at a temperature higher than 450° C., the selection ratio is less than 1 (for example, 0.8 at 500° C.) and the etching rate of silicon nitride film is lower than the etching rate of quartz. Based on this, it is found that quartz is etched more than silicon nitride film.

In addition, at a temperature not more than 450° C., the selection ratio is not less than 1 (for example, 1.4 at 400° C. and 1.5 at 350° C.) and the etching rate of silicon nitride film is higher than the etching rate of quartz. Based on this, it is found that silicon nitride film is etched more than quartz.

From the above-described verification results, the followings are found. It is preferable that the temperature in the processing chamber 201 in the first step (thin film etching process), that is, the first temperature, be not less than 350° C. and not more than 450° C. As described above, etching of silicon nitride hardly progresses when setting the temperature in the processing chamber 201 to approx. 300° C., while etching of silicon nitride can sufficiently progress when setting the temperature to not less than 350° C. enabling silicon nitride film to be etched at an adequate etching rate.

In addition, as described above, the selection ratio (the etching rate of silicon nitride film with respect to the etching rate of quartz) is less than 1 if the temperature in the processing chamber 201 is set to higher than 450° C., while the selection ratio not less than 1 can be acquired if the temperature be set not more than 450° C., whereby silicon nitride film is etched more than quartz. As a result, the damage on the quartz member in the processing chamber 201 in the first step can be reduced. Actually, the deposited materials containing silicon nitride film sometimes cannot be uniformly adhered on the inside of the processing chamber 201 to be cleaned. For example, the film thickness of the adhered material is small or large locally. In addition, the etching rates of the adhered material can sometimes differ depending on locations because of non-uniform surface temperature of the inner wall of the processing chamber 201 and because of non-uniform pressure of the cleaning gas in the processing chamber 201. In such cases, if all deposited materials adhered to the inside of the processing chamber 201 are to be removed by etching, the surfaces of a part of the inner wall of the processing chamber 201 made of quartz glasses ($SiO_2$), or the like, can be sometimes exposed to the cleaning gas for a long period of time, which can lead to the damage. It is effective to increase the selection ratio in order to reduce the damage.

It is found from the above description that, by setting the first temperature to a value within the above-described range, a silicon nitride film can be etched at an adequate etching rate while the damage on the quartz member in the processing chamber 201 being suppressed.

In addition, it is preferable that the temperature in the processing chamber 201, that is, the second temperature be not less than 400° C. and not more than 500° C. in the second step (treatment process). As described above, while etching of quartz does not progress much if the temperature in the processing chamber 201 is set to less than 400° C., adequate etching rate for quartz can be acquired if the temperature is set to not less than 400° C. Note that, etching of silicon nitride also sufficiently advances at this temperature. Therefore, it is possible to remove the adhered materials, such as, minute quartz powders remaining and adhered on the inside of the processing chamber 201 after the first step, remaining silicon nitride films, or the like. At the same time, it is also possible to make the surfaces of the quartz members in the processing chamber 201 smooth by slightly etching them, thereby to suppress increase in the effective surface area in the processing chamber 201. By this configuration, it is possible to suppress generation of foreign substances in the processing chamber 201, and also possible to suppress decrease in the film formation rate in the thin film formation process which is immediately after the cleaning process, i.e., the first step (thin film etching process) and the second step (treatment process). Note that, in the case where the temperature in the processing chamber 201 is set to not less than 400° C. and not more than 450° C., etching of quartz can sufficiently progress, although the etching rate of quartz is equal to or slightly lower than the etching rate of silicon nitride film. In the case where the temperature in the processing chamber 201 is set to not less than 450° C. and not more than 500° C., the etching rate of quartz becomes greater than the etching rate of silicon nitrite film, enabling making the surfaces of the quartz members, such as the process tube 203, the boat 217, or the like, smooth more quickly.

Meanwhile, if the temperature in the processing chamber 201 is set to greater than 500° C., there is a concern on corrosion of metal members in the processing chamber 201 or in the gas flow passage, such as the manifold 209, the seal cap 219, the rotational axis 255, the exhaust pipe 231, the pressure adjustment unit 242, or the like. However, it is possible to suppress corrosion of the metal members by setting the temperature to not more than 500° C.

It is found from the above that, by setting the second temperature to a value within the above-described range, the adhered materials remaining on the inside of the processing chamber 201 after the first step and the surfaces of the quartz members can be properly etched, while corrosion of the metal members in the processing chamber 201 are suppressed.

Meanwhile, both the temperature (first temperature) in the processing chamber 201 in the first step (thin film etching process), and the temperature (second temperature) in the processing chamber 201 in the second step (treatment process), may be set to temperatures not less than 400° C. and not more than 450° C. This temperature region enables the etching reaction of a silicon nitride film to sufficiently progress, and also enables the etching reaction of quartz to progress. In this case, the etching rate of quartz is equal to or slightly lower than the etching rate of silicon nitride film. In other words, it would be safe to say that this temperature region is an intermediate temperature region which enables a silicon nitride to be etched equally or slightly superior to quartz.

It is found from the above that, in the temperature region not less than 400° C. and not more than 450° C., both etching of silicon nitride film and etching of quartz can be performed substantially equally, and the first step and the second step can be continuously performed at a same temperature. In other words, by making the first temperature and the second temperature substantially equal in this temperature region, the cleaning can be performed stably without the need for changing the temperature in the processing chamber 201 when a transition is made from the first step to the second step, and thus generating no waiting time associated with the change in the temperature.

Alternatively, the temperature (first temperature) in the processing chamber 201 in the second step (treatment process) may be set higher than the temperature (second temperature) in the processing chamber 201 in the first step (thin film etching process). Specifically, it is possible to set the first temperature such that it has the selection ratio (the etching rate of silicon nitride film with respect to the etching rate of quartz) more than 1, and to set the second temperature such that it has the selection ratio less than 1. In other words, silicon nitride film can be etched more than quartz in the first step (thin film etching process), and quartz can be etched more than silicon nitride film in the second step (treatment process). As a result, compared with the case where the first step and the second step are continuously performed at a same temperature, over-etching of quartz can be suppressed. Specifically, over-etching of quartz can be suppressed because the selection ratio is more than 1 in the first step. In addition, in the second step, the etching rate of quartz can be further enhanced, whereby the adhered materials such as minute quartz powders remaining and adhered to the inside of the processing chamber 201, remaining silicon nitride films, or the like, can be quickly removed, and the surfaces of the quartz members in the processing chamber 201 can be quickly and properly etched, whereby the surfaces can be made smooth.

Note that, it is preferable that the pressure (first pressure) in the processing chamber 201 in the first step (thin film etching process) and the pressure (second pressure) in the processing chamber 201 in the second step (treatment process) be set to not less than 50 Torr and not more than 200 Torr. It is possible to enable etching to sufficiently progress and increasing etching uniformity, if the first pressure and the second pressure are set to values within this range. If the first and second pressures are too low, the etching rates will become low in the first and second steps, disabling etching to sufficiently advance. Etching can sufficiently progress by setting these pressures to not less than 50 Torr (6650 Pa). On the other hand, if the first and second pressures are too high, etching will become unbalanced although the etching rate increases leading to non-uniform etching. Etching uniformity can be enhanced by setting the pressures to not more than 200 Torr (26600 Pa).

According to the present embodiment, the above-described advantageous effects can be obtained, since the conditions such as the first temperature, the second temperature, and the like, are set as described above on the basis of the above-described verification results. Specifically, since the first temperature is set to a value within the above-described range, a silicon nitride film can be etched at an adequate etching rate, while the damage on the quartz members in the processing chamber 201 is suppressed. Further, since the second temperature is set to a value within the above-described range, the adhered materials remaining on the inside of the processing chamber 201 after the first step, and the surfaces of the quartz members can be properly etched, while corrosion of the metal members in the processing chamber 201 is suppressed.

Further, according to the present embodiment, in the first step (thin film etching process) and the second step (treatment process), as the cleaning gas, hydrogen-containing gas, such as HF gas, $H_2$ gas, or the like, is not supplied to the inside of the processing chamber 201. Instead, $F_2$ gas solely or $F_2$ gas diluted by an inert gas solely is supplied to the inside of the processing chamber 201. As a result, HF-induced corrosion of the metal members in the processing chamber 201 or in the gas flow passage, such as, the manifold 209, the seal cap 219, the rotational axis 255, the exhaust pipe 231, the pressure adjustment unit 242, or the like, can be suppressed, and generation of metallic contamination in the processing chamber 201 can be suppressed. Further, HF-induced erosion of the quartz members in the processing chamber 201 (the process tube 203, the boat 217, or the like) can be suppressed, and breakage of the quartz members can be suppressed.

Further, according to the present embodiment, there is no need for performing the seasoning process, in order to suppress generation and dispersion of foreign substances after the cleaning, and in order to suppress decrease in the film formation rate in the thin film formation process after the cleaning. In other words, there is no need for supplying processing gas to the inside of the processing chamber 201 in the state where the wafers 200 have not been loaded to the processing chamber 201 after the cleaning, so as to form a thin film (pre-coat) on the inner wall, or the like, of the processing chamber 201. Conventionally, the seasoning process took a long time, which partially contributed to increase in the down-time of the substrate processing apparatus. However, according to the present embodiment which eliminates the needs for performing the seasoning process, the down-time of the substrate processing apparatus can be greatly reduced.

EXAMPLES

Example 1

Figure 2:
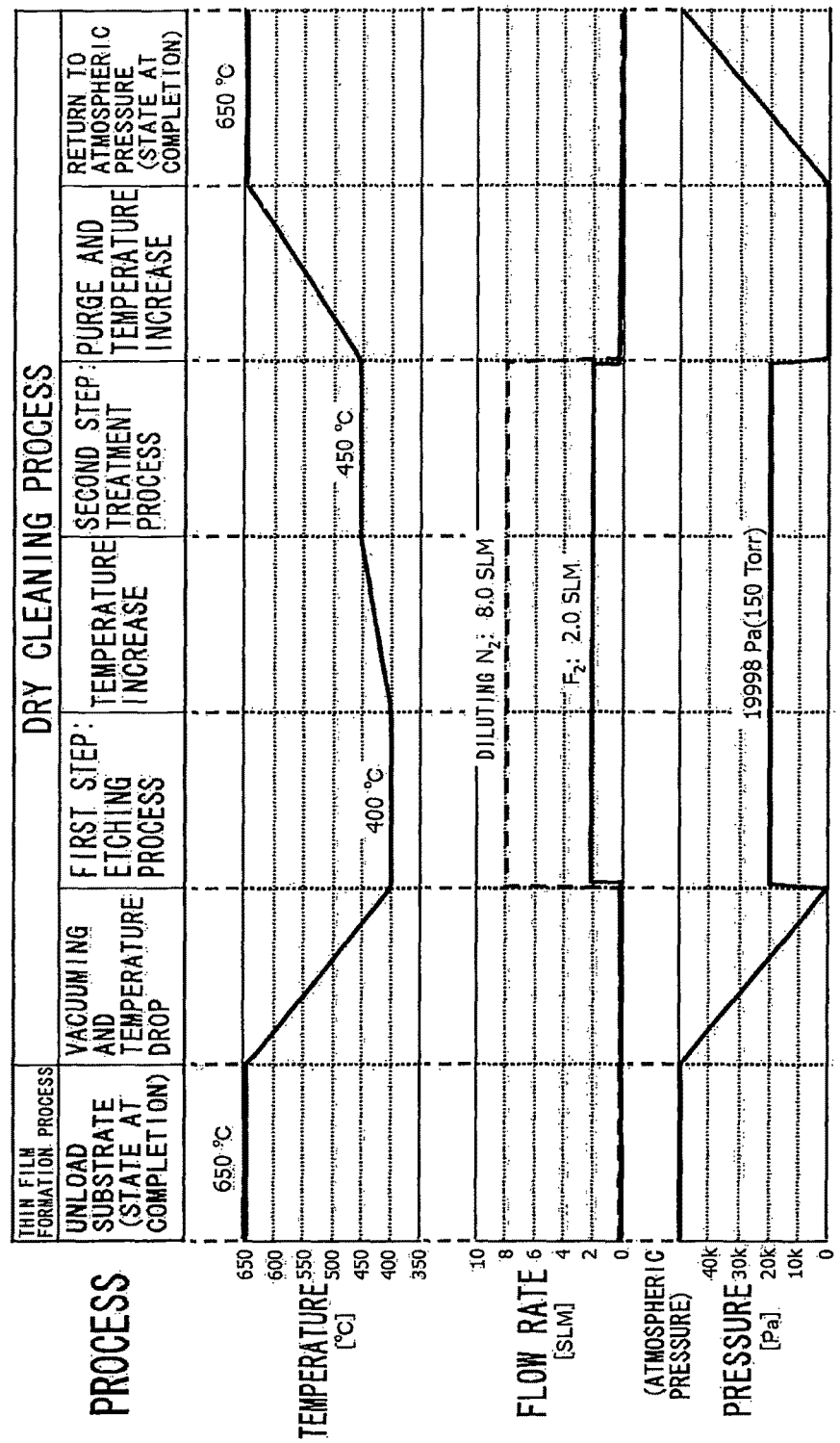
FIG. 2 is a graph chart showing a sequence and cleaning conditions of a cleaning step according to Example 1 of the present invention.

As Example 1 of the present invention, a case where the cleaning is performed, with the temperature (second temperature) in the processing chamber 201 in the second step (treatment process) being set higher than the temperature (first temperature) in the processing chamber 201 in the first step (thin film etching process) will be described. FIG. 2 is a graph chart showing the sequence and the cleaning conditions of the cleaning step according to the Example 1 of the present invention.

In the thin film formation process of Example 1, a silicon nitride film was formed with use of $SiH_2Cl_2$ (DCS) gas and $NH_3$ gas, as the processing gas, in accordance with the same method and conditions as those in the above-described embodiment. The film thickness of the silicon nitride to be formed by a single thin film formation process was set to 500 Å. After the thin film formation process was performed 16 times (every time when cumulative film thickness becomes 8000 Å), the cleaning process (thin film etching and treatment) was performed. Meanwhile, the temperature in the processing chamber 201 was set to 650° C. and the pressure in the processing chamber 201 was set to the atmospheric pressure, after completion of 16-times of the thin film formation process (when the processed wafers 200 were unloaded).

In the cleaning step of the Example 1, first, the processing chamber 201 was vacuum evacuated, while the temperature in the processing chamber 201 was decreased to 400° C. Subsequently, the first step (thin film etching process) was performed, with the temperature (first temperature) in the processing chamber 201 being set to 400° C., and subsequently, the second step (treatment process) was performed, with the temperature (second temperature) in the processing chamber 201 being set to 450° C. Note that, the pressure in the processing chamber 201 was set to 19998 Pa (150 Torr), the supply flow rate of $F_2$ gas was set to 2.0 slm, and the supply flow rate of $N_2$ gas was set to 8.0 slm, in the first step (thin film etching process) and the second step (treatment process). After completion of the cleaning step, the processing chamber 201 was purged, the pressure in the processing chamber 201 was increased to the atmospheric pressure, and the temperature in the processing chamber 201 was increased to 650° C.

The 16 times of thin film formation processes and the subsequent cleaning step were assumed as 1 cycle. Next, this cycle was repeated a plurality of times. Every time the thin film formation process is completed, the amount of increased foreign substances in the processing chamber 201 was measured, and the film formation rate of silicon nitride film was also measured.

Example 2

Figure 3:
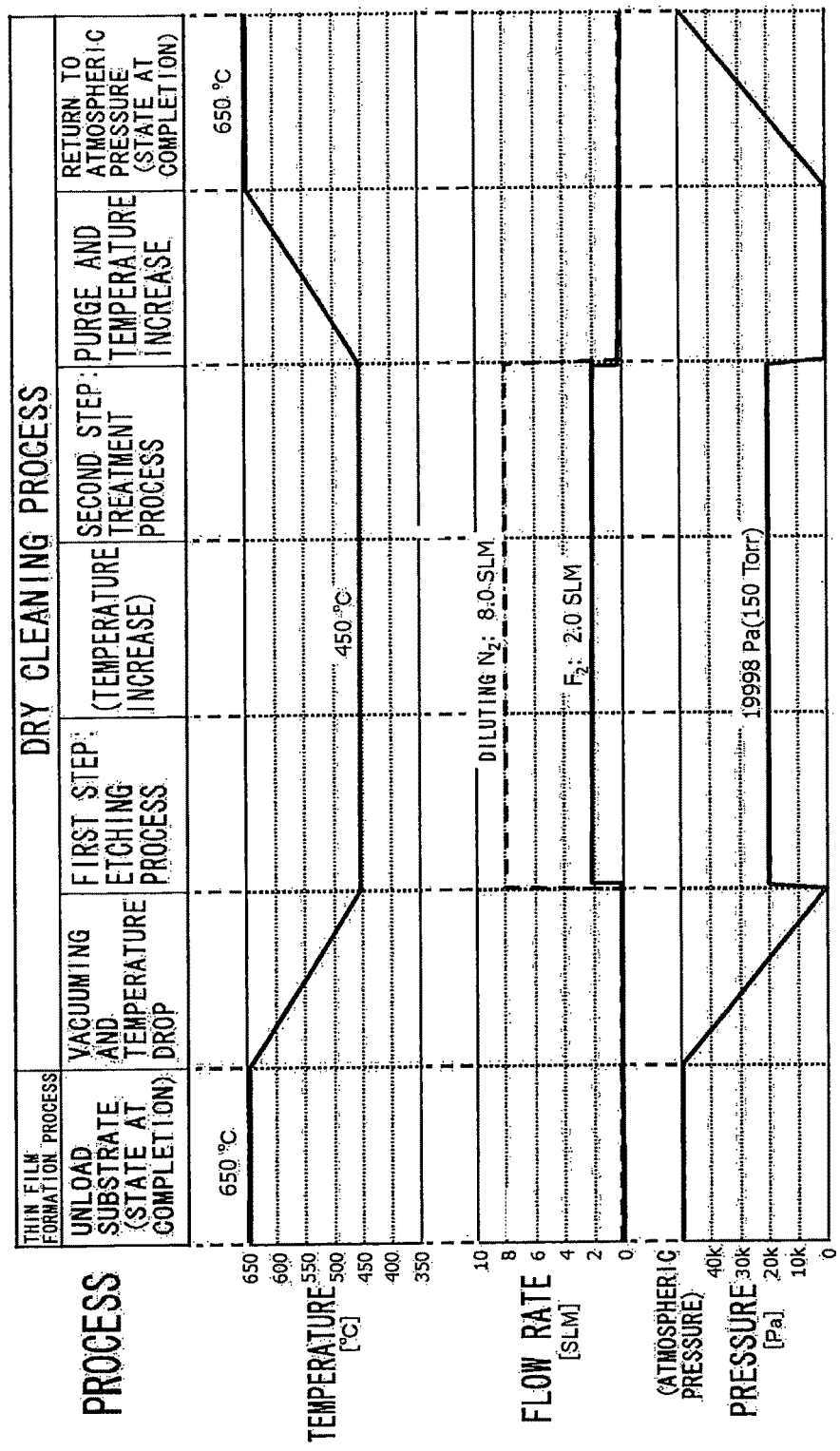
FIG. 3 is a graph chart showing a sequence and cleaning conditions of a cleaning step of according to Example 2 of the present invention.

As Example 2 of the present invention, a case where the cleaning step was performed, with both the temperature (first temperature) in the processing chamber 201 in the first step (thin film etching process) and the temperature (second temperature) in the processing chamber 201 in the second step (treatment process) being set to 450° C., will be described. FIG. 3 is a graph chart showing the sequence and the cleaning conditions of the cleaning according to the Example 2 of the present invention. Other conditions are the same as those in the Example 1.

As is the case with the Example 1, the 16 times of the thin film formation processes and the subsequent cleaning step were assumed as 1 cycle. Next, the cycle was repeated a plurality of times. Every time the thin film formation process is completed, the amount of increased foreign substances in the processing chamber 201 was measured, and the film formation rate of silicon nitride film was also measured.

In both the Example 1 and the Example 2, it was confirmed that increase of the foreign substances in the processing chamber 201 was suppressed. In the conventional dry etching method, in the case where the seasoning process in the processing chamber 201 was not performed, the number of the increased foreign substances in the processing chamber 201 was 50 or more. On the contrary, in each of the Example 1 and the Example 2, it was confirmed that the number of the increased foreign substances in the processing chamber 201 was suppressed to approx. 20 to 30.

Figure 4:
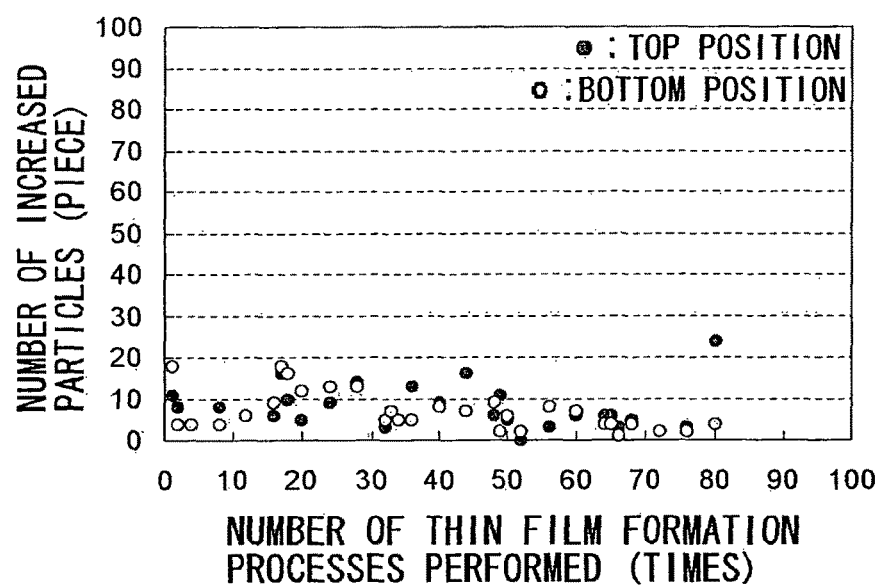
FIG. 4 is a graph chart showing a validation data on an amount of foreign substances generated according to the Example 2 of the present invention.

FIG. 4 is a graph chart showing the validation data on the amount of foreign substances generated according to the Example 2 of the present invention. The vertical axis in FIG. 4 shows the number of increased foreign substances (particles) with the particle diameter not less than 0.13 μm (unit: piece) at each measurement position in the processing chamber 201, and the horizontal axis shows the number of the thin film formation processes (number of batches) performed. The mark "○" shows the number of increased foreign substances at a top position (upper portion) of the processing chamber 201, and the mark "●" shows the number of increased foreign substances at a bottom position (lower portion) of the processing chamber 201. It is found from FIG. 4 that increase of the foreign substances in the processing chamber 201 was suppressed to approx. 20 to 30.

In addition, in both the Example 1 and the Example 2, it was confirmed that decrease in film formation rate of silicon nitride film was suppressed. In the conventional dry etching method, the film formation rate of silicon nitride film immediately after the dry etching sometimes dropped by more than ±2%. On the contrary, in the Example 1 and the Example 2, decrease in film formation rate of silicon nitride film was within ±0.96%, and it was observed that decrease in film formation rate immediately after the cleaning step was suppressed.

Figure 5:
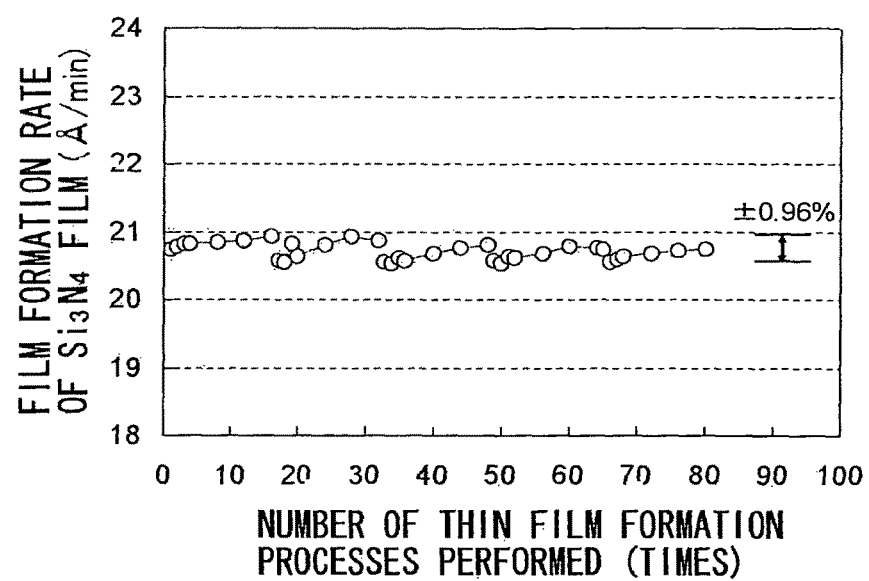
FIG. 5 is a graph chart showing a validation data on reproducibility of a film formation rate according to the Example 2 of the present invention.

FIG. 5 is a graph chart showing the validation data on reproducibility of the film formation rate according to the Example 2 of the present invention. The vertical axis in FIG. 5 shows the film formation rate of silicon nitride film (unit: Å/min), and the horizontal axis shows the number of the thin film formation processes (number of batches) performed. It is found from FIG. 5 that decrease in film formation rate of silicon nitride film was within ±0.96%, and that decrease in film formation rate immediately after the cleaning step was suppressed.

In both the Example 1 and the Example 2, it was confirmed that no corrosion was generated in the metal members, for example, such as the manifold 209, the seal cap 219, the rotational axis 255, the exhaust pipe 231, the pressure adjustment unit 242, or the like, in the processing chamber 201 or in the gas flow passage after the cleaning (etching and treatment). In addition, it was confirmed that no erosion or breakage of the quartz members in the processing chamber 201 (the process tube 203, the boat 217, or the like) was generated.

Example 3

As Example 3 of the present invention, a case in which the cleaning in the above-described embodiment (Example 1, Example 2) and LTP (Low Temperature Purge) are combined will be described. The LTP, also called as the low temperature purge, herein refers to purge of the inside of the processing chamber 201 with gas, while applying a thermal impact onto the thin film deposited on the inside of the processing chamber 201 by decreasing a temperature in the processing chamber 201, so as to forcibly generate a crack in the thin film and forcibly peel the adhered material adhered on the inside of the processing chamber with a weak adhesive force.

In the meantime, the above-described embodiment (Example 1, Example 2) is an art based on the assumption that a substrate processing apparatus which performs the dry cleaning process is operated. However, when a practical operation of the apparatus is considered, the thin films accumulated on the inside of the processing chamber 201 increase film stress as the cumulative film thickness increases, leading to generation of cracks. When external factors (heat, pressure, friction) are added to this, the film can peel off or drop, leading to increased particles as foreign substances. Accordingly, particularly in the case where the film thickness of the thin film to be performed in a single thin film formation process is large, or the like, the dry cleaning process need be performed with a relatively short cycle period. Accordingly, the operation rate of the substrate processing apparatus can sometimes drop.

Figure 8:
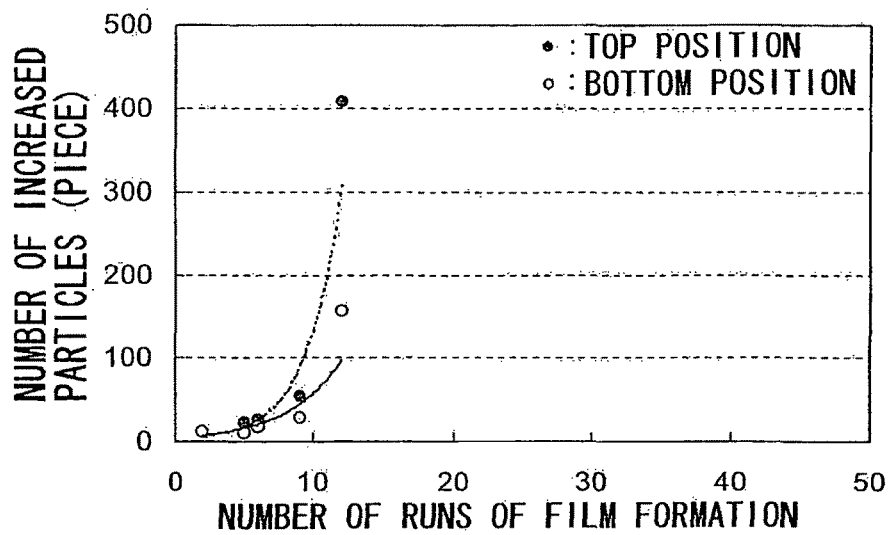
FIG. 8 is a graph chart showing transition of particles generated after a dry cleaning process.

FIG. 8 shows transition of particles generated after the dry cleaning process. The vertical axis in FIG. 8 shows the number of the increased particles with the particle diameter not less than 0.13 μm at each measurement positions in the processing chamber 201 (unit: piece), and the horizontal axis shows the number of the thin film formation processes (number of batches) performed after the dry cleaning was performed, that is, the number of runs of $Si_3N_4$ film formations (number of processings in batch). The mark "●" shows the number of increased foreign substances at the top position (upper portion) in the processing chamber 201, and the mark "○" shows the number of increased foreign substances at the bottom position (lower portion) in the processing chamber 201. Note that, in the thin film formation process, an $Si_3N_4$ film of 0.15 μm per run was formed with use of DCS gas and $NH_3$ gas, as the processing gas, in accordance with the same method and conditions as those in the above-described embodiment. It is found from FIG. 8 that, although the particles increased slightly and stably immediately after the dry cleaning, the particles increased sharply at the $12^{th}$ run of the $Si_3N_4$ film formation (which is equivalent to the cumulative film thickness 2 μm), and that the dry cleaning process need be performed when the cumulative film thickness is less than 2 μM. Based also on this fact, it is found that, particularly in the case where the film thickness of the thin film to be formed per thin film formation process is large, the dry cleaning process need be performed with a short cycle period, and accordingly the operation rate of the apparatus drops greatly.

Therefore, the task is to achieve the apparatus operation by performing the dry cleaning process with a long cycle period so as to suppress generation of particles for a long time and enhance the operation rate of the apparatus. Therefore, in Example 3, description will be given on the dry cleaning art (apparatus operation) which enables maintaining a high operation rate of the apparatus by combined use of LTP in the apparatus operation, assuming that the dry cleaning process is performed.

In the present Example, the process of purging the inside of the processing chamber 201 with gas while decreasing the temperature in the processing chamber 201 during the thin film formation process or immediately after the thin film formation process, in the state where the wafers 200 are present in the processing chamber 201 or in the state where the wafers 200 are not present in the processing chamber 201, thereby to apply a thermal impact on the thin films accumulated on the inside of the processing chamber 201 so as to forcibly generate cracks in the thin films and to forcibly peel the adhered material with a weak adhesive force, is performed, periodically or every time the thin film formation process is performed. By this configuration, the cumulative film thickness until the thin films accumulated on the inside of the processing chamber 201 start peeling off or dropping can be increased, and the cleaning cycle can be made longer. Next, at the time point when the thickness of the thin films accumulated on the inside of the processing chamber 201 reaches a predetermined thickness before the thin films start peeling off or dropping, cleaning of the inside of the processing chamber 201 is performed. In the cleaning process, the step, as the first step, of removing a thin film accumulated on the inside of the processing chamber 201 by supplying a fluorine gas solely or a fluorine gas diluted by an inert gas solely, as the cleaning gas, to the inside of the processing chamber 201 heated to the first temperature (thin film etching process), and, the step, as the second step, of removing adhered materials remaining in the processing chamber 201 after removing the thin film, by supplying a fluorine gas solely or a fluorine gas diluted by an inert gas solely, as the cleaning gas, to the inside of the processing chamber 201 heated to the second temperature (treatment process) are performed. By this configuration, the life of the quartz members such as the process tube 203, or the like, can be extended, which does not require maintenance, for a long period of time, involving exchange of the quartz members or the like.

In the LTP process, it is preferable that the temperature in the processing chamber 201 be sharply decreased (fluctuated) from the film formation temperature exceeding 600° C., to a low temperature of 200 to 400° C. at which cracks occur, during the thin film formation process, or between the thin film formation process and the subsequent thin film formation process. When the temperature in the processing chamber 201 is sharply decreased, it is preferable that the inside of the processing chamber 201 be forcibly cooled (rapidly cooled) by causing cooling medium, such as an air, $N_2$, or the like, to flow to the outside of the processing chamber 201, while the high-temperature atmospheric gas at the outside of the processing chamber 201 is discharged.

Figure 10:
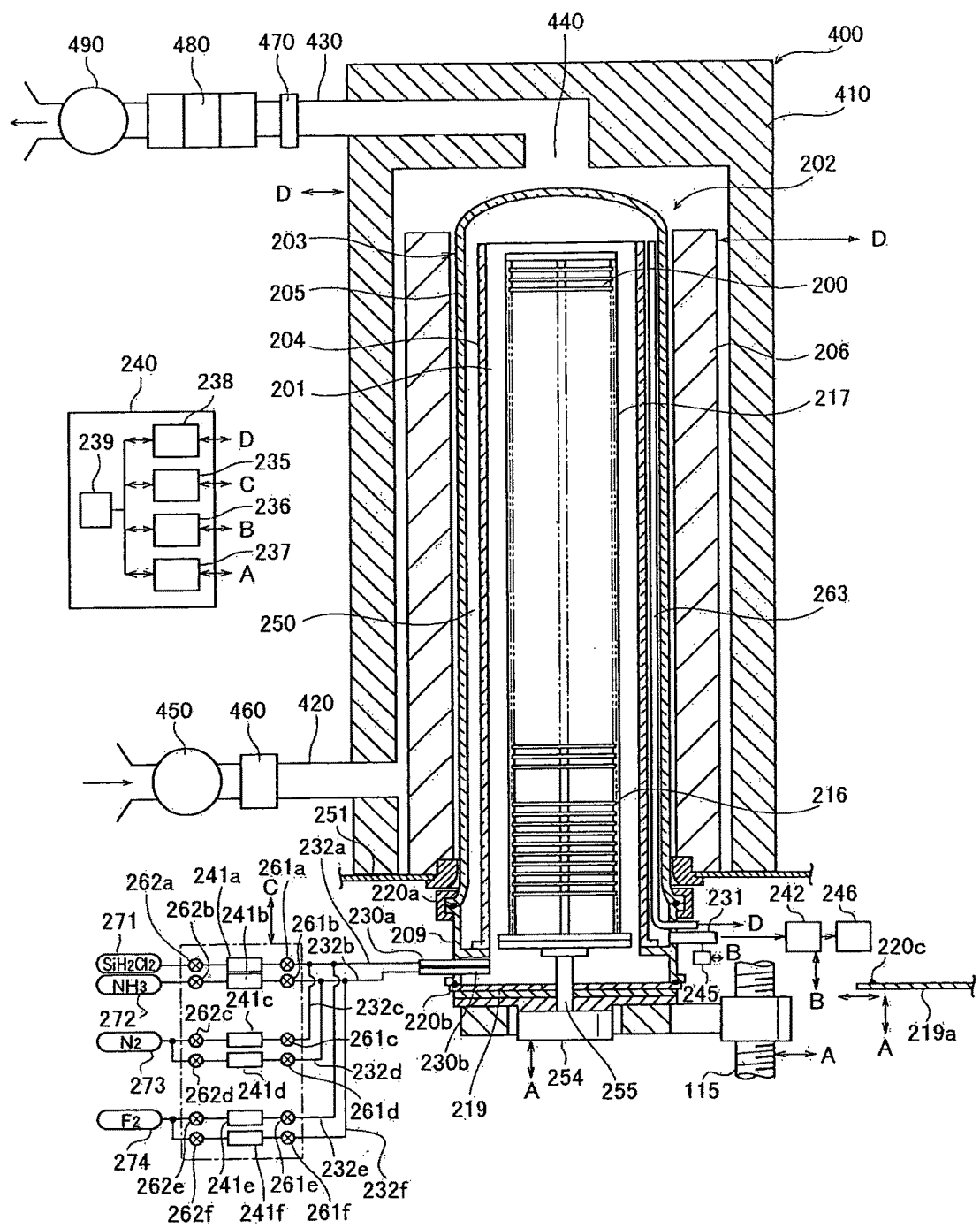
FIG. 10 is a schematic view of a processing furnace of a substrate processing apparatus including a forced-cooling mechanism which is preferably used in the Example 3 of the present invention.

In this case, as shown in FIG. 10, it is preferable that a forced-cooling mechanism (rapid-cooling mechanism) 400 be provided outside of the processing chamber 201 (processing furnace 202) so as to cover the processing chamber 201, and that the controller 240 control the forced-cooling mechanism 400, the heater 206, the purge gas supply system, and the exhaust system, such that the inside of the processing chamber 201 is purged with gas, while the temperature in the processing chamber 201 is decreased by forcibly cooling the inside of the processing chamber 201. The forced-cooling mechanism 400 is provided so as to cover the process tube 203 and the heater 206. The forced-cooling mechanism 400 includes: a heat insulation cover 410 provided so as to cover the process tube 203 and the heater 206, a supply line 420 provided in communication with the internal space of the heat insulation cover 410, and an exhaust line 430 in communicated with the internal space of the heat insulation cover 410 via an exhaust hole 440 in the ceiling portion of the heat insulation cover 410. The supply line 420 is provided with an intake blower 450 and a shutter 460. The exhaust line 430 is provided with a shutter 470, a radiator 480, and an exhaust blower 490. The forced-cooling mechanism 400 is electrically connected to the temperature controller 238 configured to control the forced-cooling mechanism 400 at desired timings. In the LTP process, when the temperature in the processing chamber 201 is decreased by forcibly cooling the inside of the processing chamber 201 by means of the forced-cooling mechanism 400, the shutters 460, 470 are released and the high-temperature atmospheric gas in the heat insulation cover 410 is exhausted by the exhaust blower 490. At the same time, cooling medium such as air, $N_2$, or the like, is introduced to the inside of the heat insulation cover 41 by the intake blower 450. Note that, in FIG. 10, elements which are the substantially same as the elements described with reference to FIG. 7 are given with the same numerals as those in FIG. 7, and the description thereof will be omitted.

Note that, the LTP process can also be performed, under the control by the controller 240 of the heater 206, and the purge gas supply and exhaust systems, such that the inside of the processing chamber 201 is purged with gas while the temperature in the processing chamber 201 is decreased, without use of the forced-cooling mechanism 400. However, it is more preferable that the temperature in the processing chamber 201 be sharply fluctuated with use of the forced-cooling mechanism 400, because a thermal impact on the thin films accumulated on the inside of the processing chamber 201 can be made larger, and the particle discharge effect can be enhanced. In addition, the LTP process may be performed every time the thin film formation process is performed, or may be performed periodically at certain intervals. With the total particle discharge effect being taken into consideration, it is preferable that the LTP process be performed every time the thin film formation process is performed.

In the cleaning step, as is the case with the above-described embodiment, it is preferable that, $F_2$ gas solely, or $F_2$ gas diluted by an inert gas such as $N_2$ (nitrogen), Ar (argon), He (helium), or the like solely, be supplied as the cleaning gas. In addition, in the thin film etching process, as the first step, it is preferable that the thin films accumulated on the inside of the processing chamber 201 be removed, while the first temperature is maintained at a certain temperature within the temperature range from not less than 350° C. to not more than 450° C. In addition, in the treatment process, as the second step, it is preferable that the adhered materials remaining in the reaction chamber be removed, while the second temperature is maintained at a certain temperature within the temperature range from not less than 400° C. to not more than 500° C. Note that, in the thin film etching process, as the first step, and in the treatment process, as the second step, the first and second temperatures may be set to a constant temperature within the temperature range from not less than 400° C. to not more than 450° C., or the second temperature in the treatment process as the second step may be set to a temperature equal to or higher than the first temperature in the thin film etching process as the first step.

Figure 9:
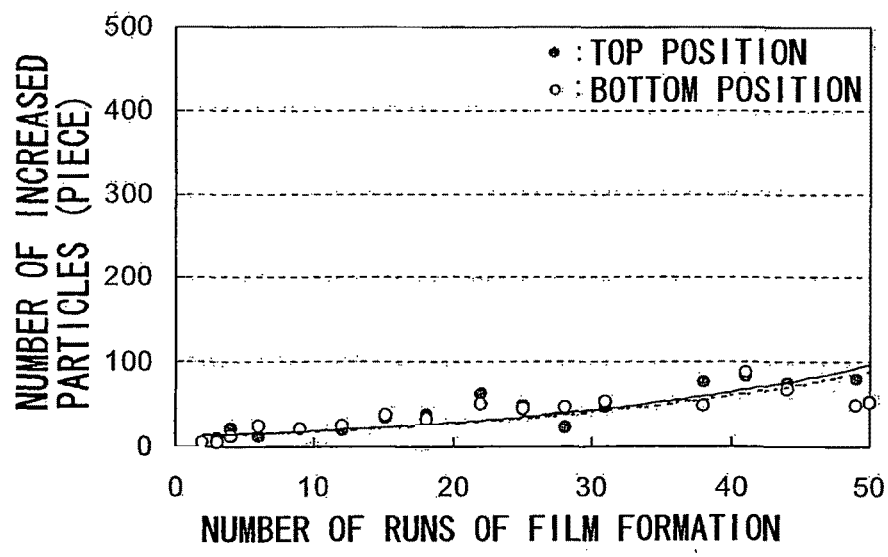
FIG. 9 is a graph chart showing stability of particles after a dry cleaning process according to Example 3 of the present invention.

Hereinafter, the process characteristics acquired in the substrate processing apparatus shown in FIG. 10, that is, the CVD apparatus for $Si_3N_4$ film formation including the forced-cooling mechanism 400, with the method in the Example 3 of the present invention being applied, will be described. FIG. 9 shows stability of particles after the dry cleaning process according to the Example 3. The vertical axis in FIG. 9 shows increase of the particles with the particle diameter not less than 0.13 μm in the processing chamber 201 at each measurement position (unit: piece), and the horizontal axis shows the number of the thin film formation processes (number of batches) performed, that is, the number of $Si_3N_4$ film formations (number of processings in batch) after the dry cleaning was performed. In addition, the mark "●" in FIG. 9 shows the number of increased foreign substances at the top position (lower portion) of the processing chamber 201, and the mark "○" shows the number of increased foreign substances at the bottom position (lower portion) of the processing chamber 201. Note that, in the thin film formation step, an $Si_3N_4$ film of 0.15 μm per run was formed, with use of DCS gas and $NH_3$ gases as the processing gas, in accordance with the same method and conditions as those in the above-described embodiment. In addition, the dry cleaning was performed in the similar method and conditions as those in the Example 2. The LTP was performed, every time the thin film formation process was performed, in the state where no wafers 200 were present in the processing chamber 201, by decreasing the temperature in the processing chamber 201, from a film formation temperature of 650 to 800° C., to 400° C., at the temperature decrease rate 20° C./min, and at the same time, by exhausting $N_2$ gas by means of the exhaust system, while the purge-gas supply system is supplying $N_2$ in a large amount at the flow rate 20 L/min or higher to the inside of the processing chamber 201, in the state where the pressure in the processing chamber 201 is set to the atmospheric pressure. At this time, the lower end of the manifold 209 is sealed by the furnace opening shutter 219a via the O ring 220c. Note that, the LTP process was performed in parallel with the wafer cooling and wafer discharge, after the boat 217 holding the processed wafers 200 was unloaded from the inside of the processing chamber 201 (boat unload). In FIG. 8, where the LTP is not used together, the particles sharply increased at the $12^{th}$ run of the $Si_3N_4$ film formation (which is equivalent to the cumulative film thickness 2 μm). However, in FIG. 9 where the method in the Example 3 is applied, there was no significant increase of the particles, at least from immediately after the dry cleaning process was performed to the $50^{th}$ run of the $Si_3N_4$ film formation (which is equivalent to the cumulative film thickness 8 μm), and thus a favorable data was obtained.

According to the present Example, by adding the LTP process to the dry cleaning technologies as the basis during or after the thin film formation process, it is possible to suppress generation of particles associated with the increased cumulative film thickness after the dry cleaning, and to extend and the dry cleaning cycle period. Therefore, it is possible to maintain a high operation rate of the apparatus, greatly contributing to improvement in productively.

Conventionally, in the specifications in which the dry cleaning process is not performed (specifications which perform part exchange, and wet cleaning), and only the LTP process is performed during or after the thin film formation process, work requiring manual labor, such as attachment and detachment operation of component members in the reaction furnace, the cleaning operation, or the like, is necessary, at the time point when a certain cumulative film thickness is reached. However, in the present Example, only the thin film formation process, the LTP process, and the dry cleaning process need be performed, which provides good maintenance performance.

Furthermore, the extended dry cleaning cycle period by use of the LTP process as well as the suppression of damage on the quartz members, such as the process tube, by means of the dry cleaning process with use of $F_2$ gas, enables extending the life of the quartz members compared with the conventional apparatus, which eliminates the need for maintenance involving exchange of quartz members, or the like, for a long period of time. According to the present Example, the device can be made free from maintenance for a 1-year period or longer after the substrate processing apparatus starts film formation.

Furthermore, the LTP process during or after the thin film formation process generates cracks on the surfaces of the thin films accumulated on the inside of the processing chamber, which increases the effective surface area of the cumulative film in the dry cleaning, and the essential contact area of the cumulative film with $F_2$ gas. Accordingly, the etching reaction between $F_2$ gas with the cumulative film is made easier to progress, which could contribute also to reduction of the etching time.

Note that, in the above-described Example 3, description was given on the case where, $F_2$ gas solely or $F_2$ gas diluted by an inert gas solely is used as the cleaning gas. However, in the method in Example 3, that is, in the film formation according to the "LTP+the dry cleaning specification", $F_2$ may be replaced by a halogen-based gas, such as $ClF_3$, $NF_3$, or the like (fluorine-based gas), as the cleaning gas.

Provided that, even in the case of the film formation according to the "LTP+the dry cleaning specifications", as described in the embodiment, it is preferable that, $F_2$ gas solely or $F_2$ gas diluted by an inert gas solely be used, as the cleaning gas, for performing the thin film etching process and the treatment process. In other words, it is preferable that the thin film etching process and the treatment process with use of $F_2$ gas, be combined with the LTP process.

Let us image the case where thin film etching process with use of $F_2$ gas, $ClF_2$ gas, $NF_3$ gas or the like, be combined with the LTP process (in the case where the treatment process is not performed after the thin film etching process). In this case, there are following disadvantages.

As shown in FIG. 11A, foreign substances, such as quartz powders, remain on the quartz surfaces after the thin film etching process ("Cleaning"). The foreign substances are adhered to the quartz surfaces in an unstable state. In the thin film formation process ("SiN Deposition"), the thin film is deposited on the foreign substances. When the LTP process is performed in this state, when the thin film cracks or peels off, the foreign substances adhered to the quartz surfaces also crack and peel off. Further, the adhesion state of the foreign substances onto the quartz surfaces becomes more unstable, which disables stopping generation of foreign substances. In addition, because of the unstable adhesion state of the foreign substances onto the quartz surfaces, foreign substances are more likely generated, when a thin film is formed after the LTP ("SiN Deposition").

On the contrary, in the case where the thin film etching process and the treatment process using $F_2$ gas are combined with the LTP process, the following advantages are obtained.

As shown in FIG. 11B, after the treatment process (Treatment) is performed subsequent to the thin film etching process (Cleaning) is completed, it is possible to prevent foreign substances from remaining on the quartz surfaces. In other words, no foreign substances are adhered on the quartz surfaces in an unstable state. In the thin film formation process (SiN Deposition), the thin film is deposited on the quartz surfaces on which no foreign substance is present. When the LTP process is performed in this state, even if the thin film cracks or peels off, no foreign substances will be generated since no foreign substances have been adhered to the quartz surfaces. In addition, also when a thing film is formed (SiN Deposition) after the LTP, no foreign substances are generated.

It is found from the above that, in the case of the film formation according to the "LTP+the dry cleaning specification", it is preferable that the thin film etching process and the treatment process with use of $F_2$ gas be combined with LTP.

Preferred Embodiments of the Present Invention

Hereinafter, preferred embodiments of the present invention will be added.

According to one aspect of the present invention, a method for manufacturing a semiconductor device is provided. The method includes the steps of: loading a substrate into a processing chamber; performing a processing of forming a thin film on the substrate by supplying a processing gas to an inside of the processing chamber heated to a processing temperature; unloading the processed substrate out of the processing chamber; and cleaning the inside of the processing chamber by supplying a cleaning gas to the inside of the processing chamber, in the state where the substrate is not present in the processing chamber. The step of cleaning the inside of the processing chamber includes the steps of: removing the thin film deposited on the inside of the processing chamber by supplying a fluorine gas solely or a fluorine gas diluted by an inert gas solely, as the cleaning gas, to the inside of the processing chamber heated to a first temperature; and removing an adhered material remaining on the inside of the processing chamber after removing the thin film, by supplying a fluorine gas solely or a fluorine gas diluted by an inert gas solely, as the cleaning gas, to the inside of the processing chamber heated to a second temperature.

It is preferable that the first temperature be set to not less than 350° C. and not more than 450° C., and the second temperature should be set to not less than 400° C. and not more than 500° C.

It is preferable that both the first and second temperatures should be set to not less than 400° C. and not more than 450° C.

It is preferable that the second temperature should be set to equal to or greater than the first temperature.

It is preferable that the pressure in the processing chamber should be set to not less than 6650 Pa (50 Torr) and not more than 26600 Pa (200 Torr), when performing the cleaning (that is, when removing the thin film and when removing the adhered material).

It is preferable that the pressure in the processing chamber should be set to not less than 13300 Pa (100 Torr) and not more than 19950 Pa (150 Torr) when performing the cleaning (when removing the thin film and when removing the adhered material).

It is preferable that the first temperature should be a temperature at which the thin film is more etched than the member constituting the processing chamber and the second temperature should be a temperature at which the member constituting the processing chamber is more etched than the thin film.

It is preferable that the first and second temperatures should be temperatures at which the thin film and the member constituting the processing chamber is equally etched, or the thin film is etched slightly more than the member constituting the processing chamber.

It is preferable that the member constituting the processing chamber should include a quartz member, the thin film should be a silicon nitride film, the first temperature should be a temperature at which the silicon nitride film is more etched than the quartz member, and the second temperature should be a temperature at which the quartz member is more etched than the silicon nitride film.

It is preferable that the member constituting the processing chamber should include a quartz member, the thin film should be a silicon nitride film, and the first and second temperatures should be temperatures at which the silicon nitride film and the quartz member are equally etched or the silicon nitride film is etched slightly more than the quartz member.

It is preferable that the first temperature should be a temperature at which the etching rate of the thin film is greater than the etching rate of the member constituting the processing chamber and the second temperature should be a temperature at which the etching rate of the member constituting the processing chamber is greater than the etching rate of the thin film.

It is preferable that the first and second temperatures should be temperatures at which the etching rate of the thin film and the etching rate of the member constituting the processing chamber are equal or the etching rate of the thin film is slightly larger than the etching rate of the member constituting the processing chamber.

It is preferable that the member constituting the processing chamber should include a quartz member, the thin film should be a silicon nitride film, the first temperature should be a temperature at which the etching rate of the silicon nitride film is greater than the etching rate of the quartz member, and the second temperature should be a temperature at which the etching rate of the quartz member is greater than the etching rate of the silicon nitride film.

It is preferable that the member constituting the processing chamber should include a quartz member, the thin film should be a silicon nitride film, and the first and second temperatures should be temperatures at which the etching rate of the silicon nitride film and the etching rate of the quartz member are equal, and the etching rate of the silicon nitride film is slightly larger than the temperature than the etching rate of the quartz member.

It is preferable that the member constituting the processing chamber should include a quartz member and a metal member.

It is preferable that the member constituting the processing chamber should include a quartz member and a metal member, the thin film should be a silicon nitride film, and the adhered material should include quartz powders.

It is preferable that the method should further include the step of: purging the inside of the processing chamber with gas while applying a thermal impact onto the thin film deposited on the inside of the processing chamber by decreasing a temperature in the processing chamber to a temperature lower than the processing temperature, so as to forcibly generate a crack in the thin film and forcibly peel the adhered material adhered on the inside of the processing chamber with a weak adhesive force, in the state where the substrate is not present in the processing chamber.

According to another aspect of the present invention, a method for manufacturing a semiconductor device is provided. The method includes the steps of: loading a substrate into a processing chamber; performing a processing of forming a thin film on the substrate by supplying a processing gas to an inside of the processing chamber; unloading the processed substrate out of the processing chamber; and cleaning the inside of the processing chamber by supplying a cleaning gas to the inside of the processing chamber. The step of cleaning includes the steps of removing the thin film deposited on the inside of the processing chamber by supplying a gas which does not contain a hydrogen-containing gas but contains a fluorine gas, as the cleaning gas, to the inside of the processing chamber heated to a first temperature; and removing an adhered material remaining on the inside of the processing chamber after removing the thin film by supplying a gas which does not contain a hydrogen-containing gas but contains a fluorine gas, as the cleaning gas, to the inside of the processing chamber heated to a second temperature.

According to a still another aspect of the present invention, a method for manufacturing a semiconductor device is provided. The method includes the steps of: loading a substrate into a processing chamber; performing a processing of forming a thin film on the substrate by supplying a processing gas to an inside of the processing chamber; unloading the processed substrate out of the processing chamber; and cleaning the inside of the processing chamber by supplying a cleaning gas to the inside of the processing chamber. The step of cleaning the inside of the processing chamber includes the steps of: removing the thin film deposited on the inside of the processing chamber by supplying a fluorine gas solely, as the reactive gas, to the inside of the processing chamber heated to a first temperature; and removing an adhered material remaining on the inside of the processing chamber after removing the thin film by supplying a fluorine gas solely, as the cleaning gas, to the inside of the processing chamber heated to a second temperature.

According to a still another aspect of the present invention, a method for manufacturing a semiconductor device is provided. The method includes the steps of: loading a substrate into a processing chamber composed of a member including a quartz member and a metal member; perform a processing of forming a silicon nitride film on the substrate by supplying a processing gas to the inside of the processing chamber; unloading the processed substrate out of the processing chamber; and cleaning the inside of the processing chamber by supplying a cleaning gas to the inside of the processing chamber. The step of cleaning the inside of the processing chamber includes the steps of: removing the silicon nitride film deposited on the inside of the processing chamber by supplying a fluorine gas solely or a fluorine gas diluted by an inert gas solely, as the cleaning gas, to the inside of the processing chamber heated to a first temperature; and removing an adhered material containing quartz powders which remains on the inside of the processing chamber after removing the silicone nitride film by supplying a fluorine gas solely or a fluorine gas diluted by an inert gas solely, as the cleaning gas, to the inside of the processing chamber heated to a second temperature.

According to a still another aspect of the present invention, a method for manufacturing a semiconductor device is provided. The method includes the steps of: loading a substrate into a processing chamber composed of a member including a quartz member and a metal member; performing a processing of forming a silicon nitride film on the substrate by supplying a processing gas to an inside of the processing chamber; unloading the processed substrate out of the processing chamber; and cleaning the inside of the processing chamber by supplying a cleaning gas to the inside of the processing chamber, in the state where the substrate is not present in the processing chamber. The step of cleaning the inside of the processing chamber includes the steps of: removing a silicon nitride film deposited on the inside of the processing chamber by supplying a fluorine gas solely or a fluorine gas diluted by an inert gas solely, as the cleaning gas, to the inside of the processing chamber in which a temperature is set to not less than 350° C. and not more than 450° C. and a pressure is set to not less than 6650 Pa and not more than 26600 Pa; and removing an adhered material including quarts powders remaining on the inside of the processing chamber after removing the silicon nitride film, by supplying a fluorine gas solely or a fluorine gas diluted by an inert gas solely, as the cleaning gas, to the inside of the processing chamber in which a temperature is set to not less than 400° C. and not more than 500° C. and a pressure is set to not less than 6650 Pa and not more than 26600 Pa.

According to a still another aspect of the present invention, a substrate processing apparatus is provided. The substrate processing apparatus includes: a processing chamber for performing a processing of forming a thin film on a substrate; a processing gas supply system for supplying a processing gas to an inside of the processing chamber; a cleaning gas supply system for supplying a cleaning gas to the inside of the processing chamber; a heater for heating the inside of the processing chamber; and a controller for controlling the heater, the processing gas supply system, and the cleaning gas supply system, so as to, when performing the processing on the substrate in the processing chamber, perform the processing of forming a thin film on the substrate by supplying a processing gas to the inside of the processing chamber while heating the inside of the processing chamber to a processing temperature; and so as to, when cleaning the inside of the processing chamber, in a state where the substrate is not present in the processing chamber, remove the thin film deposited on the inside of the processing chamber by supplying a fluorine gas solely or a fluorine gas diluted by an inert gas solely, as the cleaning gas, to the inside of the processing chamber while heating the inside of the processing chamber to a first temperature, and subsequently remove an adhered material remaining on the inside of the processing chamber after removing the thin film by supplying a fluorine gas solely or a fluorine gas diluted by an inert gas solely, as the cleaning gas, to the inside of the processing chamber while heating the inside of the processing chamber to a second temperature.

According to a still another aspect of the present invention, a method for manufacturing a semiconductor device is provided. The method includes the steps of: loading a substrate into a processing chamber; performing a processing of forming a thin film on the substrate by supplying a processing gas to an inside of the processing chamber; unloading the processed substrate out of the processing chamber; purging the inside of the processing chamber with gas while applying a thermal impact onto the thin film deposited on the inside of the processing chamber by decreasing the temperature in the processing chamber, so as to forcibly generate a crack in the thin film and forcibly peel the adhered material with a weak adhesive force, in a state where the substrate is not present in the processing chamber; and cleaning the inside of the processing chamber by supplying a cleaning gas to the inside of the processing chamber. The step of cleaning the inside of the processing chamber includes the steps of: removing the thin film deposited on the inside of the processing chamber by supplying a fluorine-based gas, as the cleaning gas, to the inside of the processing chamber heated to a first temperature, and removing an adhered material remaining on the inside of the processing chamber after removing the thin film by supplying a fluorine-based gas, as the cleaning gas, to the inside of the processing chamber heated to a second temperature.

According to a still another aspect of the present invention, a method for manufacturing a semiconductor device is provided. The method includes the steps of: loading a substrate into a processing chamber; performing a processing of forming a thin film on the substrate by supplying a processing gas to an inside of the processing chamber; unloading the processed substrate out of the processing chamber; purging the inside of the processing chamber with a gas while applying a thermal impact onto the thin film deposited on the inside of the processing chamber by decreasing the temperature in the processing chamber, so as to forcibly generate a crack in the thin film and forcibly peel the adhered material with a weak adhesive force, in the state where the substrate is not present in the processing chamber; and cleaning the inside of the processing chamber by supplying a cleaning gas to the inside of the processing chamber. The step of cleaning the inside of the processing chamber includes the steps of: removing the thin film deposited on the inside of the processing chamber by supplying a fluorine gas solely or a fluorine gas diluted by an inert gas solely, as the cleaning gas, to the inside of the processing chamber heated to a first temperature; and removing an adhered material remaining on the inside of the processing chamber after removing the thin film by supplying a fluorine gas solely or a fluorine gas diluted by an inert gas solely, as the cleaning gas, to the inside of the processing chamber heated to a second temperature.

It is preferable that the step of purging the inside of the processing with gas chamber should forced-cool the inside of the processing chamber by causing a cooling medium to flow outside of the processing chamber.

It is preferable that the step of purging the inside of the processing chamber with gas should forced-cool the inside of the processing chamber by causing a cooling medium to flow outside the processing chamber, while exhausting a high-temperature atmospheric gas outside the processing chamber.

According to another aspect of the present invention, a substrate processing apparatus is provided. The apparatus includes: a processing chamber for performing a processing of forming a thin film on a substrate; a processing gas supply system for supplying a processing gas for forming the thin film to the inside of the processing chamber; a purge-gas supply system for supplying a purge gas to the inside of the processing chamber; a cleaning gas supply system for supplying a cleaning gas for cleaning the inside of the processing chamber to the inside of the processing chamber, an exhaust system for exhausting the inside of the processing chamber; a heater for heating the inside of the processing chamber; and a controller which controls the heater, the purge-gas supply system and the exhaust system so as to purge the inside of the processing chamber with gas while applying a thermal impact onto the thin film deposited on the inside of the processing chamber by decreasing the temperature in the processing chamber, so as to forcibly generate a crack in the thin film and forcibly peel the adhered material with a weak adhesive force, in a state where the substrate is not present in the processing chamber; and which controls the heater, the cleaning gas supply system, and the exhaust system, so as to, when cleaning the inside of the processing chamber, remove the thin film deposited on the inside of the processing chamber by supplying a fluorine gas solely or a fluorine gas diluted by an inert gas solely, as the cleaning gas, to the inside of the processing chamber while heating the inside of the processing chamber to a first temperature, and subsequently, remove the adhered material remaining on the inside of the processing chamber after removing the thin film by supplying a fluorine gas solely or a fluorine gas diluted by an inert gas solely, as the cleaning gas, to the inside of the processing chamber while heating the inside of the processing chamber to a second temperature.

According to a still another aspect of the present invention, a substrate processing apparatus is provided. The apparatus includes: a processing chamber for performing a processing of forming a thin film on a substrate; a processing gas supply system for supplying a processing gas for forming the thin film to the inside of the processing chamber; a purge-gas supply system for supplying a purge gas to the inside of the processing chamber; a cleaning gas supply system for supplying a cleaning gas for cleaning the inside of the processing chamber to the inside of the processing chamber, an exhaust system for evacuating the inside of the processing chamber; a heater for heating the inside of the processing chamber; a forced-cooling mechanism which is provided at the outside of the processing chamber so as to cover the processing chamber for forced-cooling the inside of the processing chamber; and a controller which controls the forced-cooling mechanism, the heater, the purge-gas supply system, and the exhaust system, so as to purge the inside of the processing chamber with gas by applying a thermal impact onto the thin film deposited on the inside of the processing chamber by decreasing the temperature in the processing chamber by means of forced-cooling of the processing chamber, so as to forcibly generate a crack in the thin film and forcibly peel the adhered material with a weak adhesive force, in the state where the substrate is not present in the processing chamber, and which controls the heater, the cleaning gas supply system, and the exhaust system, so as to, when cleaning the inside of the processing chamber, remove the thin film deposited on the inside of the processing chamber by supplying a fluorine gas solely or a fluorine gas diluted by an inert gas solely, as the cleaning gas, to the inside of the processing chamber while heating the inside of the processing chamber to a first temperature, and subsequently, remove the adhered material remaining on the inside of the processing chamber after removing the thin film by supplying a fluorine gas solely or a fluorine gas diluted by an inert gas solely, as the cleaning gas, to the inside of the processing chamber while heating the inside of the processing chamber to a second temperature.

According to a still another aspect of the present invention, a substrate processing apparatus is provided. The apparatus includes: a processing chamber for performing a processing of forming a thin film on a substrate; a processing gas supply system for supplying a processing gas for forming the thin film to the inside of the processing chamber; a purge-gas supply system for supplying a purge gas to the inside of the processing chamber; a cleaning gas supply system for supplying a cleaning gas for cleaning the inside of the processing chamber to the inside of the processing chamber, an exhaust system for evacuating the inside of the processing chamber; a heater for heating the inside of the processing chamber; a forced-cooling mechanism which is provided outside of the processing chamber so as to cover the processing chamber for forced-cooling the inside of the processing chamber; and a controller which controls the forced-cooling mechanism, the heater, the purge-gas supply system and the exhaust system, so as to purge the inside of the processing chamber with gas while applying a thermal impact onto the thin film deposited on the inside of the processing chamber, by decreasing the temperature in the processing chamber by means of forced-cooling of the inside of the processing chamber, so as to forcibly generate a crack in the thin film and forcibly peel the adhered material with a weak adhesive force, in a state where the substrate is not present in the processing chamber and which controls the heater, the cleaning gas supply system, and the exhaust system, so as to, when cleaning the inside of the processing chamber, remove the thin film deposited on the inside of the processing chamber by supplying a fluorine-based gas, as the cleaning gas, to the inside of the processing chamber while heating the inside of the processing chamber to a first temperature, and subsequently remove the adhered material remaining on the inside of the processing chamber after removing the thin film, by supplying a fluorine-based gas to the inside of the processing chamber, as the cleaning gas, while heating the inside of the processing chamber to a second temperature.

What is claimed is:

1. A method for manufacturing a semiconductor device comprising:
    loading a substrate into a processing chamber in which a quartz member and a metal member are contained;
    performing a processing of forming a silicon nitride film on the substrate by supplying a processing gas into the processing chamber heated to a processing temperature by a heater provided outside of the processing chamber;
    unloading the processed substrate out of the processing chamber;
    after the forming of the silicon nitride film, purging an inside of the processing chamber with a gas while applying a thermal impact to the silicon nitride film deposited on a surface of the quartz member in the processing chamber by decreasing a temperature in the processing chamber to a temperature lower than the processing temperature, so as to forcibly generate a crack in the silicon nitride film, in a state where the substrate is not present in the processing chamber,
        wherein the decreasing of the temperature in the processing chamber to the temperature lower than the processing temperature is performed by a forced-cooling mechanism outside of the processing chamber, the forced-cooling mechanism being oriented to cover the processing chamber and the heater by means of a heat insulation cover;
    at a time point when a thickness of the silicon nitride film accumulated on the surface of the quartz member in the processing chamber reaches a predetermined thickness before the silicon nitride film starts peeling off or dropping,
    removing the silicon nitride film deposited on the surface of the quartz member in the processing chamber by thermo-chemical reaction, by supplying a fluorine gas solely or a fluorine gas diluted by an inert gas solely without supplying a hydrogen-containing gas to the inside of the processing chamber heated to a first temperature, in the state where the substrate is not present in the processing chamber; and
    after the removing of the silicon nitride film, smoothening the surface of the quartz member by etching the surface of the quartz member by supplying the fluorine gas solely or the fluorine gas diluted by the inert gas solely without supplying the hydrogen-containing gas to the inside of the processing chamber heated to a second temperature, by the heater, in the state where the substrate is not present in the processing chamber,
    wherein the second temperature is set to not less than 450° C. and not more than 500° C., and
    wherein corrosion of the metal member and breakage of the quartz member are suppressed.

2. The method according to claim 1, wherein the inside of the processing chamber is forcibly cooled by causing a cooling medium to flow outside of the processing chamber in the purging with the gas.

3. The method according to claim 1, wherein the inside of the processing chamber is forcibly cooled by causing a cooling medium to flow outside of the processing chamber, while exhausting atmospheric gas outside the processing chamber in the purging with the gas.

4. The method according to claim 1, wherein the inside of the processing chamber is rapidly cooled in the purging with the gas.

5. The method according to claim 1, wherein the quartz member in the processing chamber includes a quartz member constituting the processing chamber.

6. A substrate processing apparatus, comprising:
    a processing chamber in which a quartz member and a metal member are contained and a process of forming a silicon nitride film on a substrate is performed;
    a processing gas supply system that supplies a processing gas for forming the silicon nitride film to an inside of the processing chamber;
    a purge-gas supply system that supplies a purge gas to the inside of the processing chamber;
    a cleaning gas supply system that supplies a fluorine gas solely or a fluorine gas diluted by an inert gas solely, without supplying a hydrogen-containing gas, to the inside of the processing chamber;
    an exhaust system that exhausts the inside of the processing chamber;
    a heater, provided outside of the processing chamber, that heats the inside of the processing chamber; and
    a controller:
    configured to control the heater, the purge-gas supply system, and the exhaust system so that after the forming of the silicon nitride film, the inside of the processing chamber is purged with the purge gas while applying a thermal impact to the silicon nitride film deposited on a surface of the quartz member in the processing chamber by decreasing a temperature in the processing chamber to a temperature lower than the processing temperature, so as to forcibly generate a crack in the silicon nitride film, in the state where the substrate is not present in the processing chamber,
        wherein the decreasing of the temperature in the processing chamber to the temperature lower than the processing temperature is performed by a forced-cooling mechanism outside of the processing chamber, the forced-cooling mechanism being oriented to cover the processing chamber and the heater by means of a heat insulation cover; and configured to control the heater, the cleaning gas supply system, and the exhaust system so that at a time point when a thickness of the silicon nitride film accumulated on the surface of the quartz member in the processing chamber reaches a predetermined thickness before the silicon nitride film starts peeling off or dropping, the silicon nitride film deposited on the surface of the quartz member in the processing chamber is removed by thermo-chemical reaction, by supplying the fluorine gas solely or the fluorine gas diluted by the inert gas solely without supplying the hydrogen-containing gas, to the inside of the processing chamber heated to a first temperature, in the state where the substrate is not present in the processing chamber; and after the removing of the silicon nitride film, the surface of the quartz member is smoothed by etching the surface of the quartz member by supplying the fluorine gas solely or the fluorine gas diluted by the inert gas solely without supplying the hydrogen-containing gas, to the inside of the processing chamber heated to a second temperature, by the heater, in the state where the substrate is not present in the processing chamber, wherein the second temperature is set to not less than 450° C. and not more than 500° C., and wherein corrosion of the metal member and breakage of the quartz member are suppressed.

7. A substrate processing apparatus, comprising:
a processing chamber in which a quartz member and a metal member are contained and a process of forming a silicon nitride film on a substrate is performed;
a processing gas supply system that supplies a processing gas for forming the silicon nitride film to an inside of the processing chamber;
a purge-gas supply system that supplies a purge gas to the inside of the processing chamber;
a cleaning gas supply system that supplies a fluorine gas solely or a fluorine gas diluted by an inert gas solely without supplying a hydrogen-containing gas, to the inside of the processing chamber;
an exhaust system that exhausts the inside of the processing chamber;
a heater that heats the inside of the processing chamber;
a forced-cooling mechanism which is provided outside of the processing chamber and the heater so as to cover the processing chamber and the heater, for forcibly cooling the inside of the processing chamber; and
a controller:
configured to control the forced-cooling mechanism, the heater, the purge-gas supply system and the exhaust system so that after the forming process of the silicon nitride film, the inside of the processing chamber is purged with the purge gas while applying a thermal impact to the silicon nitride film deposited on a surface of the quartz member in the processing chamber by forcibly cooling the inside of the processing chamber and decreasing a temperature in the processing chamber to a temperature lower than the processing temperature, so as to forcibly generate a crack in the silicon nitride film, in the state where the substrate is not present in the processing chamber, wherein the decreasing of the temperature in the processing chamber to the temperature lower than the processing temperature is performed by the forced-cooling mechanism, the forced-cooling mechanism being oriented to cover the processing chamber and the heater by means of a heat insulation cover; and configured to control the heater, the cleaning gas supply system, and the exhaust system so that at a time point when a thickness of the silicon nitride film accumulated on the surface of the quartz member in the processing chamber reaches a predetermined thickness before the silicon nitride film starts peeling off or dropping, the silicon nitride film deposited on the surface of the quartz member in the processing chamber is removed by thermo-chemical reaction, by supplying the fluorine gas solely or the fluorine gas diluted by the inert gas solely without supplying the hydrogen-containing gas, to the inside of the processing chamber heated to a first temperature, in the state where the substrate is not present in the processing chamber; and after the removing of the silicon nitride film, the surface of the quartz member is smoothened by etching the surface of the quartz member by supplying the fluorine gas solely or the fluorine gas diluted by the inert gas solely without supplying the hydrogen-containing gas, as a cleaning gas, to the inside of the processing chamber heated to a second temperature, by the heater, in the state where the substrate is not present in the processing chamber, wherein the second temperature is set to not less than 450° C. and not more than 500° C., and wherein corrosion of the metal member and breakage of the quartz member are suppressed.

8. The method according to claim 1, wherein the first temperature is set to not less than 350° C. and not more than 450° C.

9. The method according to claim 1, wherein the first temperature is set to not less than 400° C. and not more than 450° C.

10. The method according to claim 1, wherein the second temperature is equal to or not less than the first temperature.

11. The method according to claim 8, wherein a pressure of the inside of the processing chamber is set to not less than 6650Pa and not more than 26600Pa in the removing of the silicon nitride film by the thermo-chemical reaction and the smoothing of the surface of the quartz member.

12. The method according to claim 10, wherein a pressure in the processing chamber in the removing the silicon nitride film by the thermo-chemical reaction, and a pressure in the processing chamber in the smoothening of the surface of the quartz member, are set equal to each other.

13. The method according to claim 1, wherein the quartz member in the processing chamber includes a quartz member constituting the processing chamber, and the first temperature is a temperature at which the silicon nitride film is more etched than the quartz member and the second temperature is a temperature at which the quartz member is more etched than the silicon nitride film.

14. The method according to claim 1, wherein the quartz member in the processing chamber includes a quartz member constituting the processing chamber, and the first temperature is a temperature at which an etching rate of the silicon nitride film is greater than an etching rate of the quartz member constituting the processing chamber, and the second temperature is a temperature at which an etching rate of the quartz member constituting the processing chamber is greater than an etching rate of a silicon nitride film.

15. The method according to claim 1, wherein the quartz member in the processing chamber includes a member constituting the processing chamber, and the first and second temperatures are temperatures at which the silicon nitride film and the quartz member are equally etched, or the silicon nitride film is etched slightly more than the quartz member.

16. The method according to claim 1, wherein the quartz member in the processing chamber includes a quartz member constituting the processing chamber, and the first and second temperatures are temperatures at which an etching rate of the silicon nitride film and an etching rate of the quartz member are equal or the etching rate of the silicon nitride film is slightly larger than the etching rate of the quartz member.

17. A method for operating a substrate processing apparatus, comprising:
    loading a substrate into a processing chamber of the substrate processing apparatus, the processing chamber containing a quartz member and a metal member;
    performing a processing of forming a silicon nitride film on the substrate by supplying a processing gas into the processing chamber heated to a processing temperature by a heater provided outside of the processing chamber;
    unloading the processed substrate from the processing chamber;
    after the forming of the silicon nitride film, purging an inside of the processing chamber with a gas while applying a thermal impact to the silicon nitride film deposited on a surface of the quartz member in the processing chamber by decreasing a temperature in the processing chamber to a temperature lower than the processing temperature, so as to forcibly generate a crack in the silicon nitride film, in a state where the substrate is not present in the processing chamber,
        wherein the decreasing of the temperature in the processing chamber to the temperature lower than the processing temperature is performed by a forced-cooling mechanism outside of the processing chamber, the forced-cooling mechanism being oriented to cover the processing chamber and the heater by means of a heat insulation cover; and
    at a time point when a thickness of the silicon nitride film accumulated on the surface of the quartz member in the processing chamber reaches a predetermined thickness before the silicon nitride film starts peeling off or dropping, cleaning the inside of the processing chamber after repeating the loading the substrate, the performing the processing, the unloading the processed substrate and the purging the inside of the processing chamber,
    wherein the cleaning of the inside of the processing chamber comprises:
        removing the silicon nitride film deposited on the surface of the quartz member in the processing chamber by thermo-chemical reaction, by supplying a fluorine gas solely or a fluorine gas diluted by an inert gas solely without supplying a hydrogen-containing gas, to the inside of the processing chamber heated to a first temperature, in the state where the substrate is not present in the processing chamber; and
        after the removing of the silicon nitride film, smoothening the surface of the quartz member by etching the surface of the quartz member by supplying the fluorine gas solely or the fluorine gas diluted by the inert gas solely without supplying the hydrogen-containing gas, to the inside of the processing chamber heated to a second temperature, by the heater, in the state where the substrate is not present in the processing chamber,
    wherein the second temperature is set to not less than 450° C. and not more than 500° C., and
    wherein corrosion of the metal member and breakage of the quartz member are suppressed.

18. The method according to claim 1, wherein a heater is provided outside of the processing chamber, and a forced-cooling mechanism is provided outside of the processing chamber and the heater so as to cover the processing chamber and the heater; and
    the inside of the processing chamber is forcibly cooled by the forced-cooling mechanism in the purging with the gas.

19. The method according to claim 1, wherein the quartz member in the processing chamber includes a quartz member constituting the processing chamber, and the metal member in the processing chamber includes a metal member constituting the processing chamber.

* * * * *